US012581649B2

(12) United States Patent
Huo et al.

(10) Patent No.: US 12,581,649 B2
(45) Date of Patent: Mar. 17, 2026

(54) SEMICONDUCTOR DEVICE, FABRICATION METHOD, AND MEMORY SYSTEM

(71) Applicant: YANGTZE MEMORY TECHNOLOGIES CO., LTD., Wuhan (CN)

(72) Inventors: Zongliang Huo, Wuhan (CN); Lei Xue, Wuhan (CN); Wenbin Zhou, Wuhan (CN); Wei Xu, Wuhan (CN); Yanwei Shi, Wuhan (CN); Zhengliang Xia, Wuhan (CN); Han Yang, Wuhan (CN); Xinwei Zou, Wuhan (CN); Zhaohui Tang, Wuhan (CN); Jiaji Wu, Wuhan (CN); Cheng Chen, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 497 days.

(21) Appl. No.: 18/092,109

(22) Filed: Dec. 30, 2022

(65) Prior Publication Data

US 2024/0196621 A1 Jun. 13, 2024

(30) Foreign Application Priority Data

Dec. 9, 2022 (CN) .......................... 202211596532.7

(51) Int. Cl.
| | |
|---|---|
| *H10B 43/27* | (2023.01) |
| *H01L 23/528* | (2006.01) |
| *H10B 41/10* | (2023.01) |
| *H10B 41/27* | (2023.01) |
| *H10B 41/35* | (2023.01) |
| *H10B 41/40* | (2023.01) |
| *H10B 43/10* | (2023.01) |

(Continued)

(52) U.S. Cl.
CPC ......... *H10B 43/27* (2023.02); *H01L 23/5283* (2013.01); *H10B 41/10* (2023.02); *H10B 41/27* (2023.02); *H10B 41/35* (2023.02); *H10B 41/40* (2023.02); *H10B 43/10* (2023.02); *H10B 43/35* (2023.02); *H10B 43/40* (2023.02)

(58) Field of Classification Search
CPC ........ H10B 43/27; H10B 41/10; H10B 43/35; H10B 41/35; H10B 41/40; H10B 43/40; H10B 43/10; H10B 41/27; H01L 23/5283
See application file for complete search history.

(56) References Cited

U.S. PATENT DOCUMENTS

| | | | | |
|---|---|---|---|---|
| 10,658,378 | B2 * | 5/2020 | Tao | H01L 23/5226 |
| 12,185,546 | B2 * | 12/2024 | Luo | H10B 43/35 |
| 2021/0287991 | A1 * | 9/2021 | Sun | H10B 43/35 |

* cited by examiner

*Primary Examiner* — Richard A Booth
(74) *Attorney, Agent, or Firm* — BAYES PLLC

(57) ABSTRACT

A semiconductor device includes a base and a stack structure. The base includes a first surface defining at least one memory plane region. The stack structure is disposed on the first surface, and includes a first portion located at the edge of the memory plane region and a second portion different from the first portion. The first portion includes first contact structures penetrating through the stack structure in a first direction and extending to the base. The second portion includes second contact structures electrically connected with corresponding gate conductor layers in the stack structure. A top surface of the first contact structure away from the base is flush with a top surface of the second contact structure away from the base.

20 Claims, 16 Drawing Sheets

(51) Int. Cl.
H10B 43/35         (2023.01)
H10B 43/40         (2023.01)

Figure 4:
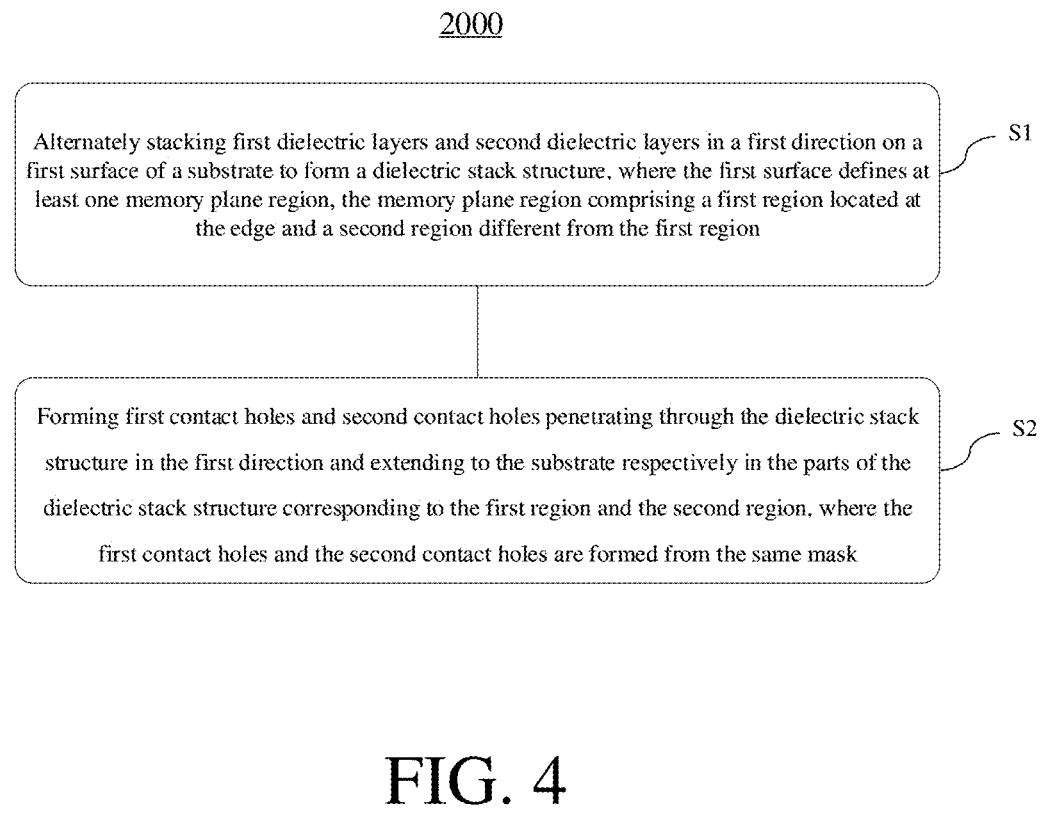

2000

Alternately stacking first dielectric layers and second dielectric layers in a first direction on a first surface of a substrate to form a dielectric stack structure, where the first surface defines at least one memory plane region, the memory plane region comprising a first region located at the edge and a second region different from the first region

S1

Forming first contact holes and second contact holes penetrating through the dielectric stack structure in the first direction and extending to the substrate respectively in the parts of the dielectric stack structure corresponding to the first region and the second region, where the first contact holes and the second contact holes are formed from the same mask

SEMICONDUCTOR DEVICE, FABRICATION METHOD, AND MEMORY SYSTEM

CROSS-REFERENCE TO RELATED APPLICATIONS

This application claims the benefit of priority to Chinese Application No. 202211596532.7, filed on Dec. 9, 2022, which is incorporated herein by reference in its entirety.

TECHNICAL FIELD

The present disclosure relates to the field of semiconductor design and manufacturing, more specifically to a semiconductor device, a fabrication method of a semiconductor device, and a memory system.

BACKGROUND

A three-dimensional memory may comprise a memory array and a peripheral circuit for controlling signals to and from the memory array. The peripheral circuit may comprise a high-voltage circuit, a low-voltage circuit, and an ultra-low-voltage circuit. Generally, the memory array and the peripheral circuit may be formed on two different wafers, respectively, and then the peripheral circuit wafer may be bonded to the memory array wafer by processes such as bonding, etc., to connect the peripheral circuit and the memory array together.

However, with the development of three-dimensional memory towards the direction of multiple layers and high densities, the dimension of the peripheral circuit wafer is becoming a key factor in determining the dimension of the whole chip. The dimension of the peripheral circuit wafer can't be further reduced because of the dimension of the high-voltage circuit thereon. Therefore, in order to improve the storage density and integration of the three-dimensional memory, the low-voltage circuit, the ultra-low-voltage circuit, and the high-voltage circuit may be integrated on different peripheral circuit wafers, respectively.

Therefore, how to combine multiple peripheral circuit wafers with memory array wafers without affecting the overall performance of the three-dimensional memory is an urgent problem to be solved at present.

SUMMARY

The present disclosure provides a semiconductor device, a fabrication method, and a memory system that can at least partially solve the above problems.

In one aspect, the present disclosure provides a semiconductor device. The semiconductor device includes a base comprising a first surface defining at least one memory plane region; and a stack structure disposed on the first surface and comprising a first portion located at an edge of the memory plane region and a second portion different from the first portion, wherein the first portion comprises first contact structures penetrating through the stack structure in a first direction and extending to the base; the second portion comprises second contact structures electrically connected with corresponding gate conductor layers in the stack structure; and a top surface of the first contact structure away from the base is flush with a top surface of the second contact structure away from the base.

In an implementation of the present disclosure, the second portion comprises memory regions and staircase regions, which are distributed in a second direction, wherein the memory regions comprise channel structures penetrating through the stack structure in the first direction, and the staircase regions comprise the second contact structures; and the first portion comprises first regions distributed in a third direction with the memory regions, wherein the first regions comprise the first contact structures, and the first direction, the second direction, and the third direction are perpendicular to one another.

In an implementation of the present disclosure, each of the memory regions corresponds to at least one of the staircase regions, and at least one of the staircase regions is located in a middle of the corresponding memory region to divide the corresponding memory region into at least two memory sub-regions.

In an implementation of the present disclosure, the second portion further comprises a plurality of stepped staircases and a covering dielectric layer covering the plurality of stepped staircases; and the second contact structure comprises a first portion and a second portion, the first portion penetrating through the covering dielectric layer in the first direction, extending to an upper surface of the corresponding gate conductor layer and electrically connected with the upper surface, and the second portion being connected with the first portion and penetrating through the stepped staircases in the first direction.

In an implementation of the present disclosure, part of the first portion extending to the upper surface extends in a plane perpendicular to the first direction, and is in contact with the upper surface.

In an implementation of the present disclosure, the first contact structure and the second contact structure have the same height in the first direction.

In an implementation of the present disclosure, the second contact structure comprises a second conductive core layer, a second adhesive layer, and a second blocking layer sequentially from inside to outside, wherein the second blocking layer comprises a first sub-layer and a second sub-layer between which a spacing exists in the first direction.

In an implementation of the present disclosure, the first contact structure comprises a first conductive core layer, a first adhesive layer, and a first blocking layer sequentially from inside to outside.

In an implementation of the present disclosure, the first conductive core layer and the second conductive core layer are made of the same material; the first adhesive layer and the second adhesive layer are made of the same material; and the first blocking layer and the second blocking layer are made of the same material.

In an implementation of the present disclosure, the semiconductor device further comprises a peripheral circuit, wherein the corresponding gate conductor layer is electrically connected with the peripheral circuit through the first portion or the second portion of the second contact structure.

In an implementation of the present disclosure, the peripheral circuit comprises a first peripheral circuit and a second peripheral circuit, wherein the first peripheral circuit is disposed on a side of the stack structure away from the base, and the second peripheral circuit is disposed on a side of the base away from the stack structure; and the corresponding gate conductor layer is electrically connected with the first peripheral circuit through the first portion or electrically connected with the second peripheral circuit through the second portion.

In another aspect, the present disclosure provides a fabrication method of a three-dimensional memory. The method includes alternately stacking first dielectric layers and second dielectric layers in a first direction on a first surface of a substrate to form a dielectric stack structure, wherein the first surface defines at least one memory plane region, the memory plane region comprising a first region located at an edge and a second region different from the first region; forming first contact holes and second contact holes penetrating through the dielectric stack structure in the first direction and extending to the substrate respectively in parts of the dielectric stack structure corresponding to the first region and the second region, wherein the first contact holes and the second contact holes are formed from the same mask.

In an implementation of the present disclosure, forming the first contact holes and the second contact holes from the same mask comprises: forming a photoresist mask layer on a surface of the dielectric stack structure away from the substrate; forming a first contact hole pattern and a second contact hole pattern in the photoresist mask layer through the same mask; and etching the dielectric stack structure through the first contact hole pattern and the second contact hole pattern to form the first contact holes and the second contact holes respectively.

In an implementation of the present disclosure, forming the second contact holes comprises: forming a plurality of stepped staircases in the part of the dielectric stack structure corresponding to the second region, and forming a covering dielectric layer on the stepped staircases; and forming the second contact holes penetrating through the covering dielectric layer and the stepped staircases in the first direction by using an etching process.

In an implementation of the present disclosure, the method further comprises: filling the second contact hole with a first dielectric filling material layer to form a dummy channel structure; removing the second dielectric layer to form a sacrificial gap, and forming a gate conductor layer in the sacrificial gap; and removing the first dielectric filling material layer, and refilling the second contact hole to form a second contact structure electrically connected with the corresponding gate conductor layer.

In an implementation of the present disclosure, the method further comprises: forming a first contact structure in a procedure of forming the second contact structure, wherein the first contact structure comprises a first conductive core layer, a first adhesive layer, and a first blocking layer sequentially from inside to outside; and the second contact structure comprises a second conductive core layer, a second adhesive layer and a second blocking layer sequentially from inside to outside, wherein the second blocking layer comprises a first sub-layer and a second sub-layer between which a spacing exists in the first direction.

In an implementation of the present disclosure, the second contact hole comprises a first hole and a second hole, and after removing the first dielectric filling material layer, the method further comprises: enlarging an aperture of the first hole to at least make an aperture of part of the first hole adjacent to the second hole larger than an aperture of part of the second hole adjacent to the first hole, wherein the first hole is part where the second contact hole penetrates through the covering dielectric layer in the first direction and extends to an upper surface of the corresponding second dielectric layer, and the second hole is part where the second contact hole penetrates through the stepped staircases in the first direction.

In an implementation of the present disclosure, forming the second contact structure electrically connected with the corresponding gate conductor layer comprises: forming a first portion of the second contact structure in the first hole, and forming a second portion of the second contact structure in the second hole, wherein part of the first portion extending to an upper surface of the corresponding gate conductor layer extends in a plane perpendicular to the first direction, and is in contact with the upper surface.

In an implementation of the present disclosure, the method further comprises filling the first contact hole with the first dielectric filling material layer to form an auxiliary support structure in a procedure of forming the dummy channel structure; and removing the first dielectric filling material layer located in the first contact hole in a procedure of removing the first dielectric filling material layer located in the second contact hole.

In an implementation of the present disclosure, the method further comprises forming a channel hole penetrating through the dielectric stack structure in the first direction in a procedure of forming the first contact hole; and filling the channel hole with a channel hole sacrificial layer before forming the dummy channel structure.

In an implementation of the present disclosure, the first dielectric filling material layer comprises a semiconductor material layer.

In yet another aspect, the present disclosure provides a memory system. The memory system includes a controller and the semiconductor device mentioned in any one of the aspects of the present disclosure, the controller being coupled to the semiconductor device and configured to control the semiconductor device to store data.

In an implementation of the present disclosure, the semiconductor device comprises at least one of a three-dimensional NAND memory and a three-dimensional NOR memory.

BRIEF DESCRIPTION OF THE DRAWINGS

Other features, objects, and advantageous effects of the present disclosure will become more apparent by reading the detailed description of the non-limiting implementations with reference to the following figures. In the drawings:

FIG. 4 is a flow diagram of a fabrication method of a semiconductor device according to an implementation of the present disclosure;

DETAILED DESCRIPTION

Figure 1A:
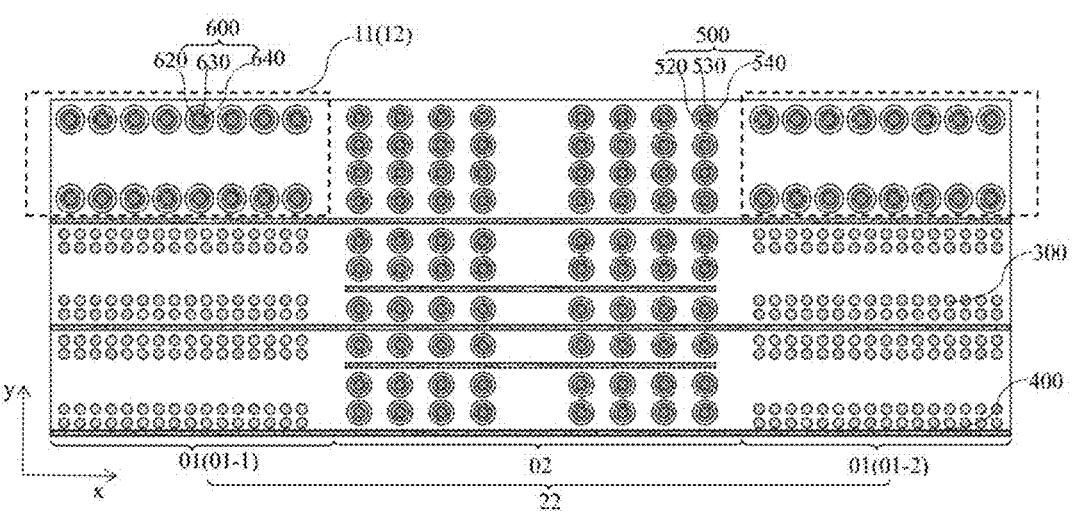
FIG. 1A is a schematic top view of a semiconductor device according to an implementation of the present disclosure.

The present disclosure will be described in detail below in conjunction with the accompanying drawings. The exemplary implementations mentioned herein are only for explanation of the application and are not intended to limit the scope of the application. Throughout the specification, similar reference numerals refer to like elements.

The thickness, size, and shape of the parts have been slightly adjusted in the drawings for ease of illustration. The drawings are illustrative only and are not drawn strictly to scale. As used herein, the terms "approximately," "about," and similar terms are used to denote approximation rather than degree and are intended to illustrate inherent deviations in measured or calculated values that will be recognized by those of ordinary skill in the art.

It should also be understood that the expression "and/or" includes any and all combinations of one or more of the associated listed items. The expressions such as "comprise," "include," and/or "have" are open rather than closed expressions in this specification that indicate the presence of the stated feature, element and/or component but do not exclude the presence or addition of one or more other feature, element, components and/or combinations thereof. Further, when the expression such as "at least one of . . . " appears after the list of listed features, it modifies the entire list of features rather than only individual elements in the list. When describing implementations of the present disclosure, "may" is used to mean "one or more implementations of the present disclosure." And the term "exemplary" is intended to refer to examples or illustrations.

In addition, in this application, when the expressions such as "connected," "covering," and/or "formed on . . . " and the like are used, they may indicate direct or indirect contact between the respective components, unless otherwise expressly defined or can be derived from the context.

All terms used herein (including technical terms and scientific terms) have the same meanings as would normally be understood by those of ordinary skill in the art to which this application pertains, unless otherwise defined. Further, unless expressly stated in this application, words defined in commonly-used dictionaries should be construed as having meanings consistent with their meanings in the context of the relevant technology and should not be construed in idealized or overly formal meanings.

It should be noted that the implementations and the features in the implementations according to this application can be combined with each other without conflict. Moreover, the specific steps in the method described herein are not necessarily limited to the order described but may be performed in any order or in parallel unless expressly defined or contrary to the context. The present disclosure will be described in detail below with reference to the accompanying drawings and in conjunction with the implementations.

Figure 1B:
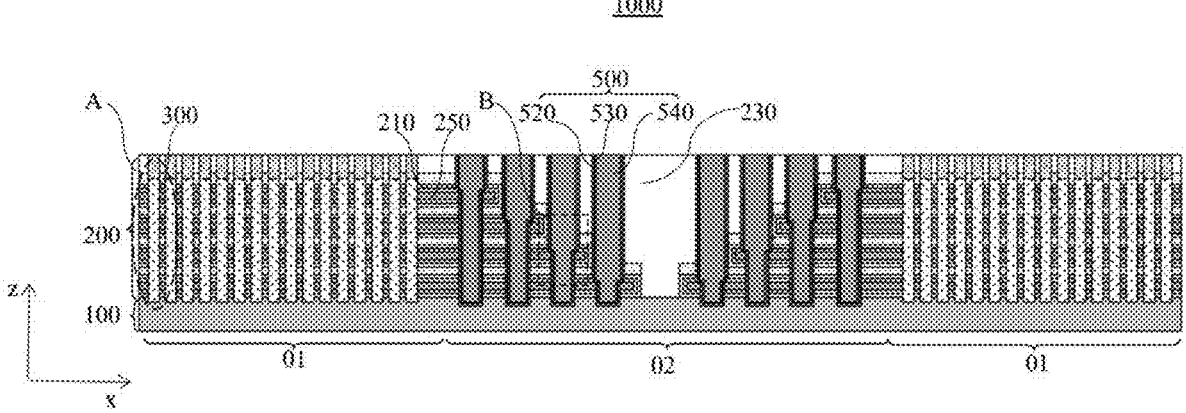
FIG. 1B is a schematic cross-sectional view of a semiconductor device according to an implementation of the present disclosure.
Figure 2:
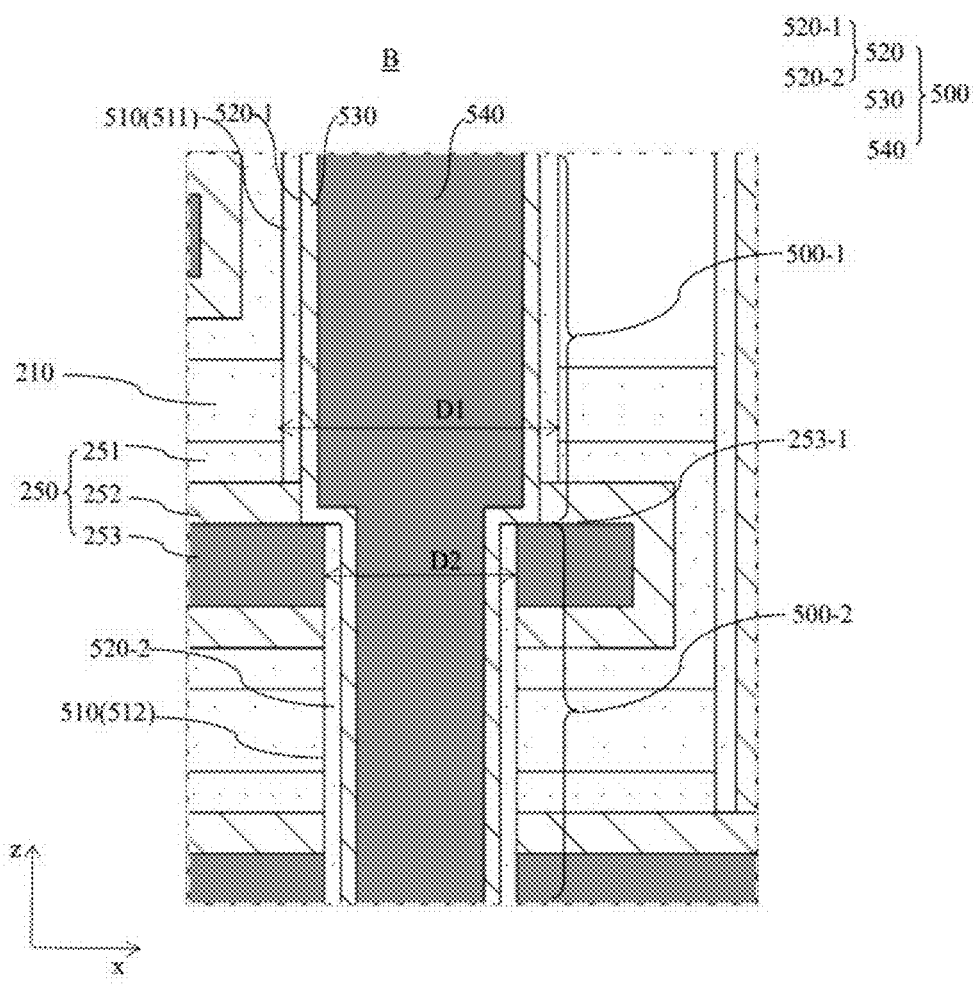
FIG. 2 is a schematic enlarged cross-sectional view of B of the semiconductor device shown in FIG. 1B.

FIG. 1A is a schematic top view of a semiconductor device 1000 according to an implementation of the present disclosure. FIG. 1B is a schematic cross-sectional view of a semiconductor device 1000 according to an implementation of the present disclosure. FIG. 2 is a schematic enlarged cross-sectional view of B of the semiconductor device 1000 shown in FIG. 1B.

As shown in FIGS. 1A to 2, the semiconductor device 1000 may comprise a base 100 and a stack structure 200, where the base 100 comprises a first surface defining at least one memory plane region, and the stack structure 200 is disposed on the first surface and comprises a first portion 11 (as shown in the square dotted box in FIG. 1A) located at the edge of the memory plane region and a second portion 22 different from the first portion. The first portion 11 comprises first contact structures 600 penetrating through the stack structure 200 in a first direction (z direction) and extending to the base 100. The second portion 22 comprises second contact structures 500 electrically connected with corresponding gate conductor layers 253 in the stack structure 200. A top surface of the first contact structure 600 away from the base 100 is flush with a top surface of the second contact structure 500 away from the base 100. By disposing the first contact structures at the edge of the memory plane in the semiconductor device, the waste of effective memory region in the semiconductor device may be avoided, thereby improving the storage density per unit area of the semiconductor device. In addition, since the first contact structures penetrate through the stack structure and extend to the base, peripheral circuits may be combined on the front side and back side of the semiconductor device, improving the integration level and overall performance of the system comprising the semiconductor device.

Exemplarily, taking a three-dimensional memory as an example, the three-dimensional memory may comprise a memory array and a peripheral circuit for controlling signals to and from the memory array. The peripheral circuit may comprise a high-voltage circuit, a low-voltage circuit, an ultra-low-voltage circuit, etc. Generally, the memory array and the peripheral circuit may be formed on two different wafers, respectively, and then the peripheral circuit wafer may be bonded to the memory array wafer by means of processes such as bonding, etc., to connect the peripheral circuit and the memory array together.

With the development of three-dimensional memory towards the direction of multiple layers and high density, the dimension of the peripheral circuit wafer is becoming a key factor in determining the dimension of the whole chip. However, the dimension of the peripheral circuit wafer can't be further reduced because of the dimension of the high-voltage circuit thereon. Therefore, in order to improve the storage density and integration of the three-dimensional memory, the low-voltage circuit and the ultra-low-voltage circuit may be integrated on one peripheral circuit wafer, and the high-voltage circuit may be integrated on the other peripheral circuit wafer.

According to the semiconductor device provided by at least one implementation of the present disclosure, by disposing the first contact structures penetrating through the stack structure and extending to the base at the edge of the memory plane, the storage density per unit area of the semiconductor device may be improved, and multiple peripheral circuit wafers and memory array wafers may be combined.

Specifically, the semiconductor device 1000 may comprise a stack structure 200 formed by alternately stacking gate layers 250 and first dielectric layers 210, where the first dielectric layers 210 may be used as an isolation stack layer, and the gate layer 250 may be formed by means of, for example, a gate-last process.

The gate layer 250 may comprise a gate conductor layer 253, which may be made of a conductive material, such as any one of tungsten (W), cobalt (Co), copper (Cu), aluminum (Al), doped crystalline silicon or silicide or any combination thereof. In addition, the gate layer 250 may further comprise an inter-wall dielectric layer 251 between the first dielectric layers 210 and the gate conductor layer 253. As an option, the inter-wall dielectric layer 251 may be a high dielectric constant dielectric layer. Furthermore, the gate layer 250 may further comprise an adhesive layer 252, such as a titanium nitride (TiN) layer, located between the first dielectric layers 210 and the gate conductor layer 253, or located between the inter-wall dielectric layer 251 and the gate conductor layer 253.

In addition, the number of layers of the stack structure 200 is not limited to the number of layers shown in the figure, but may be additionally set as required, such as 32 layers, 64 layers, 128 layers, etc. In addition, with the increasing demand for storage capacity of semiconductor devices, the memory stack layers are gradually increasing. The stack structure 200 may comprise a plurality of sub-stack structures formed by using, for example, a double-stack technology or a multiple-stack technology. The plurality of sub-stack structures may be sequentially stacked in the z direction to form the stack structure 200. The number of layers of each sub-stack structure may be identical or different. The content of a single stack structure described below may be fully or partially applicable to the stack structure formed by a plurality of sub-stack structures, so the related or similar content will not be repeated.

Figure 3:
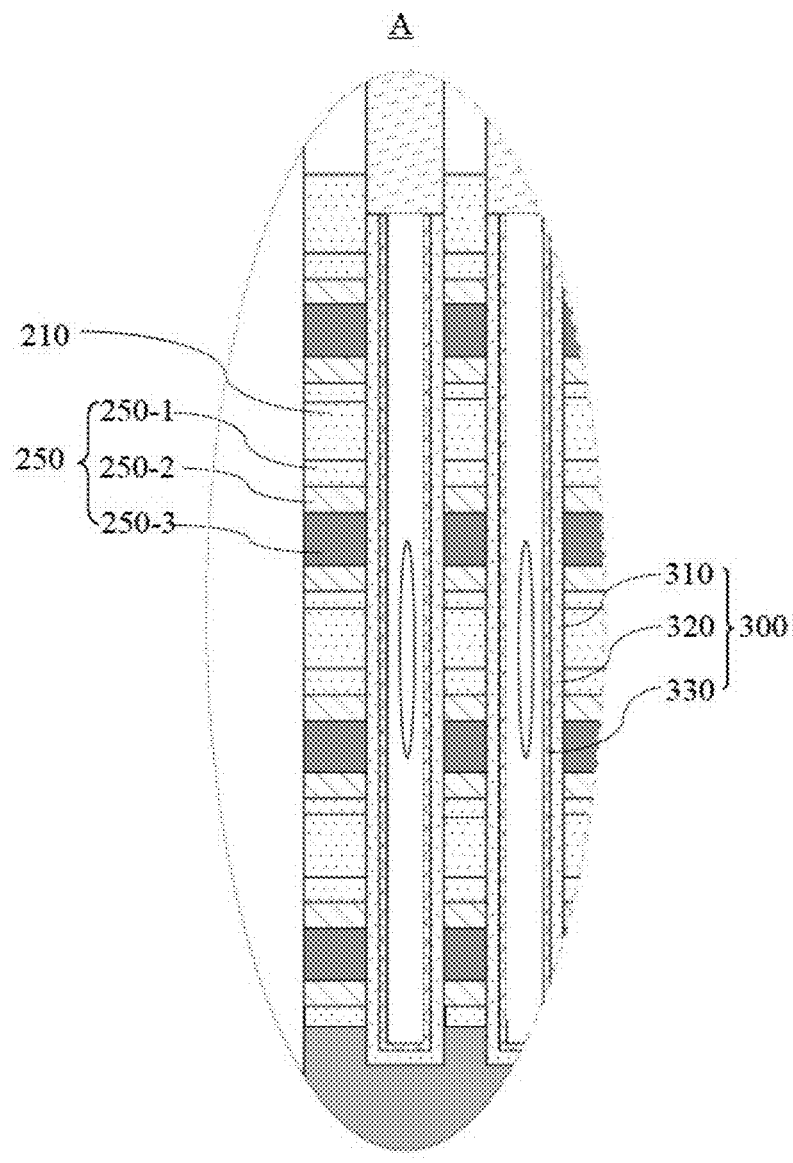
FIG. 3 is a schematic enlarged cross-sectional view of A of the semiconductor device shown in FIG. 1B.

FIG. 3 is a schematic enlarged cross-sectional view of at A of the semiconductor device 1000 shown in FIG. 1B.

As shown in FIG. 1A, FIG. 1B and FIG. 3, the second portion 22 of the stack structure 200 may comprise memory regions 01 and staircase regions 02, which are distributed in a second direction (x direction), where the memory regions 01 comprise channel structures 300 penetrating through the stack structure 200 in the z direction, and the staircase regions 02 comprises the second contact structures 500. In addition, the first portion 11 of the stack structure 200 may comprise first regions 12 distributed in a third direction (y direction) with the memory regions 01, where the first regions 12 comprise the first contact structures 600, and the x direction, y direction, and z direction are perpendicular to one another. Optionally, the first contact structure 600 may be a through silicon contact structure. The through silicon contact structure is a vertical electrical connection that completely passes through a silicon wafer or die, and provides an interconnection of vertically aligned electronic devices by significantly reducing the complexity of multi-chip electronic circuits and the overall dimension of the internal routing.

Referring to FIG. 3, a channel structure 300 may comprise a functional layer 320 and a channel layer 330 sequentially formed on the inner wall of a channel hole 310. The functional layer 320 may comprise a blocking layer (not shown), a charge trap layer (not shown), and a tunneling layer (not shown) which are sequentially disposed on the inner wall of the channel hole 310. As an option, the channel hole 310 may have a cylinder or pillar shape passing through the stack structure 200 in the z-direction. The channel layer 330 may comprise silicon, such as amorphous silicon, polysilicon, or single crystalline silicon. The material of the channel layer 330 includes but is not limited to N-type doped polysilicon. Similar to the channel hole 310, the functional layer 320 and the channel layer 330 may also have a cylinder or pillar shape passing through the stack structure 200. The channel structure 300 and a plurality of gate layers 250 may be configured in series to form a stack layer of a memory cell in the semiconductor device 1000.

Referring to FIG. 1B, the staircase region 02 may comprise a plurality of stepped staircases and a covering dielectric layer 230 covering the plurality of stepped staircases. The second contact structures 500, electrically connected with the gate conductor layers 253 of the gate layers 250, are respectively disposed on respective stepped staircases.

As an option, in an implementation of the present disclosure (see FIG. 1A), each memory region 01 corresponds to at least one staircase region 02, and at least one staircase region 02 is located in the middle of the corresponding memory region 01 to divide the corresponding memory region 01 into at least two memory sub-regions, such as a memory sub-region 01-1 and a memory sub-region 01-2. A plurality of channel structures 300 are respectively disposed in the memory sub-region 01-1 or the memory sub-region 01-2. The first region 12 comprising the first contact structures 600 may be distributed in a y direction with the memory sub-region 01-1 or the memory sub-region 01-2. The first contact structures 600 penetrate through the plurality of gate layers 250 and the plurality of first dielectric layers 210 in the z direction and extend to the base 100.

As another option, in an implementation of the present disclosure, each memory region 01 corresponds to at least one staircase region 02, and the at least one staircase region 02 is located at the periphery of a corresponding memory region 01. The staircase region 02 comprises a plurality of stepped staircases and a covering dielectric layer 230 covering the plurality of stepped staircases. The first region 12 comprising the first contact structures 600 is distributed in the y direction with at least one staircase region 02, and the first region 12 comprises the covering dielectric layer 230. The first contact structures 600 penetrate through the covering dielectric layers 230 in the z direction and extend to the base 100.

In other words, the stack structure may comprise other layers or portions (such as covering dielectric layers) in the z direction in the first region 12 besides the gate layers and the first dielectric layers. In the present disclosure, the first contact structure "penetrates through the stack structure" means that the first contact structure penetrates through all layers or portions contained in the stack structure located in its position, so as to extend to or beyond the two surfaces opposite in the z direction of the stack structure.

In conjunction with FIG. 1B and FIG. 2, in an implementation of the present disclosure, the second contact structure 500 comprises a first portion 500-1 and a second portion 500-2, the first portion 500-1 penetrating through the covering dielectric layer 230 in the z direction, extending to an upper surface 253-1 of the corresponding gate conductor layer 253 and electrically connected with the upper surface 253-1, and the second portion 500-2 being connected with the first portion 500-1 and penetrating through the stepped staircases in the z-direction.

Optionally, the part of the first portion 500-1 extending to the upper surface 253-1 extends in a plane perpendicular to the z direction, and is in contact with the upper surface 253-1. In other words, a radial dimension D1 of the part of the first portion 500-1 adjacent to the upper surface 253-1 in the plane perpendicular to the z-direction is larger than a radial dimension D2 of the second portion 500-2 in the plane perpendicular to the z-direction.

The first portion 500-1 and the second portion 500-2 of the second contact structure 500 may both be electrically connected with a gate conductor layer 253 corresponding thereto. Therefore, each gate conductor layer 253 may be electrically connected with a peripheral circuit (not shown) through the first portion 500-1 or the second portion 500-2 of the second contact structure 500 corresponding thereto. Specifically, the peripheral circuit may comprise a first peripheral circuit (not shown) and a second peripheral circuit (not shown). As an option, the first peripheral circuit may be disposed on the side of the stack structure 200 away from the base 100, and the second peripheral circuit may be disposed on the side of the base 100 away from the stack structure 200. Each gate conductor layer 253 may be electrically connected with the first peripheral circuit through the first portion 500-1 of the second contact structure 500 corresponding thereto, or electrically connected with the second peripheral circuit through the second portion 500-2 of the second contact structure 500 corresponding thereto.

In this implementation, the gate conductor layer may be selectively electrically connected to the first peripheral circuit located on the front side of the semiconductor device through the first portion of the second contact structure corresponding thereto, or connected to the second peripheral circuit located on the back side of the semiconductor device through the second portion of the second contact structure corresponding thereto, thus providing an implementation basis for the combination of multiple peripheral circuit wafers and memory array wafers, further reducing the feature dimension of the system comprising the semiconductor device, and improving the integration level and overall performance of the system.

In addition, in an implementation of the present disclosure, the first contact structure 600 and the second contact structure 500 may have the same height in the z-direction. Because the first contact structure 600 and the second contact structure 500 have the same height in the z direction, it is beneficial to forming an effective connection with the peripheral circuit, and is beneficial to the forming the first contact structure 600 and the second contact structure 500 in the same fabrication procedure of the fabrication process of the semiconductor device, thus simplifying fabrication processes of the semiconductor device and saving production costs.

Optionally, referring to FIG. 1A and FIG. 2, in an implementation of the present disclosure, the second contact structure 500 may comprise a second conductive core layer 540, a second adhesive layer 530, and a second blocking layer 520 sequentially from inside to outside, where the second blocking layer 520 may comprise a first sub-layer 520-1 and a second sub-layer 520-2 between which a spacing exists in the z-direction. The second blocking layer 520 is divided into two parts between which a spacing exists in the z direction, and can ensure that the part of the first portion 500-1 extending to the upper surface 253-1 extends in a plane perpendicular to the z direction and is in effective contact with the upper surface 253-1. In addition, the second blocking layer 520 can also ensure that each second contact structure 500 is only electrically connected with a corresponding gate conductor layer 253.

Optionally, the first contact structure 600 may comprise a first conductive core layer 640, a first adhesive layer 630, and a first blocking layer 620 sequentially from inside to outside. In addition, as mentioned above, in order to simplify the fabrication steps of the semiconductor device and reduce production costs, the first contact structure 600 and the second contact structure 500 may be formed in the same fabrication procedure, the first conductive core layer 640 and the second conductive core layer 540 may be made of the same material, the first adhesive layer 630 and the second adhesive layer 530 may be made of the same material, and the first blocking layer 620 and the first blocking layer 520 may be made of the same material.

FIG. 4 is a flow diagram of a fabrication method 2000 of a semiconductor device according to an implementation of the present disclosure. FIG. 5A to FIG. 14B are process diagrams of a fabrication method 2000 of a semiconductor device according to an implementation of the present disclosure, respectively.

As shown in FIG. 4, the fabrication method 2000 of the semiconductor device may comprise:

S1, alternately stacking first dielectric layers and second dielectric layers in a first direction on a first surface of a substrate to form a dielectric stack structure, where the first surface defines at least one memory plane region, the memory plane region comprising a first region located at the edge and a second region different from the first region; and S2, forming first contact holes and second contact holes penetrating through the dielectric stack structure in the first direction and extending to the substrate, respectively, in the parts of the dielectric stack structure corresponding to the first region and the second region, where the first contact holes and the second contact holes are formed from the same mask.

The specific processes of various steps of the above fabrication method 2000 in implementation of the present disclosure will be described in detail below in conjunction with FIG. 4 to FIG. 14B.

Step S1

Figure 5A:
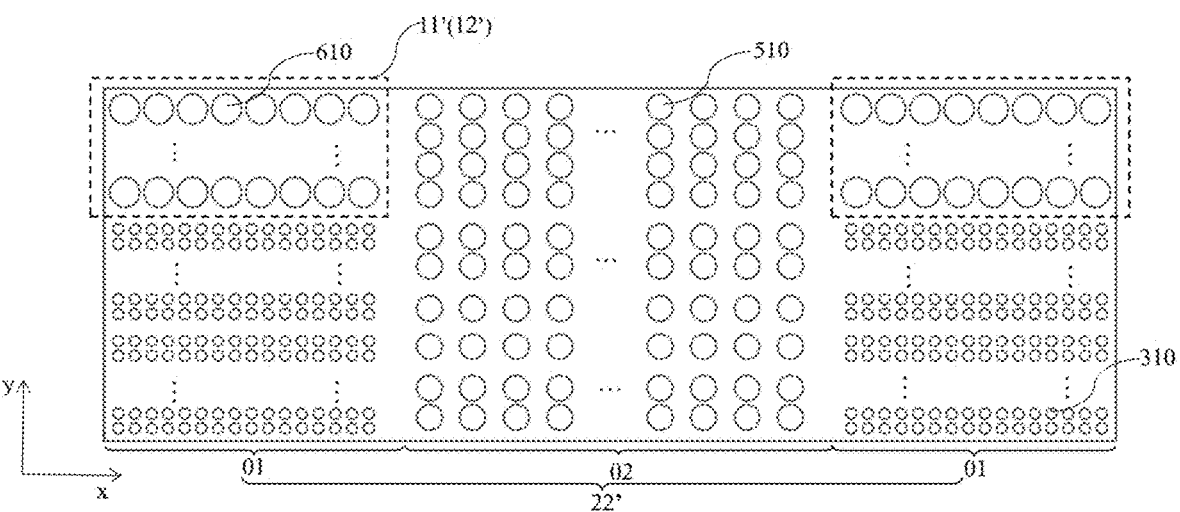
FIG. 5A to 14B are process diagrams of a fabrication method of a three-dimensional memory according to an implementation of the present disclosure, respectively.
Figure 5B:
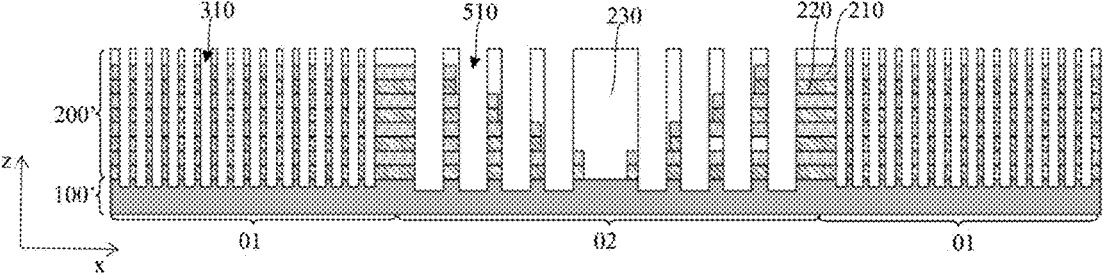
Figure 5C:
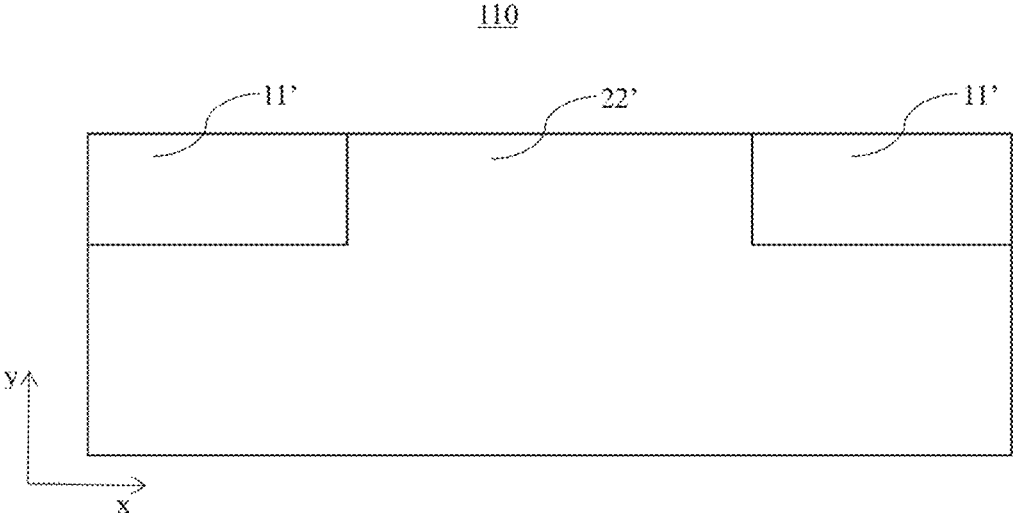

FIG. 5A is a schematic top view of a structure formed after forming a first contact hole 610 and a second contact hole 510 according to an implementation of the present disclosure. FIG. 5B is a schematic cross-sectional view of a structure formed after forming a first contact hole 610 and a second contact hole 510 according to an implementation of the present disclosure. FIG. 5C is a schematic partial top view of a first surface 110 of a substrate 100' according to an implementation of the present disclosure.

As shown in FIG. 4 to FIG. 5C, step S1 of alternately stacking first dielectric layers and second dielectric layers in a first direction on a first surface of a substrate to form a dielectric stack structure, where the first surface defines at least one memory plane region, the memory plane region comprising a first region located at the edge and a second region different from the first region, for example, may comprise: providing a substrate 100'; and alternately stacking first dielectric layers 210 and second dielectric layers 220 on the first surface 110 to form a dielectric stack structure 200'.

Specifically, in an implementation of the present disclosure, the substrate 100' may be made of any suitable semiconductor material, for example, single crystalline silicon (Si), single crystalline germanium (Ge), silicon germanium (GeSi), silicon carbide (SiC), silicon on insulator (SOI), germanium on insulator (GOI) or gallium arsenide and other group III-V compounds. Furthermore, the substrate 100' may be made of single crystalline silicon.

In an implementation of the present disclosure, the substrate 100' may be, for example, a composite substrate for supporting a device structure thereon. A plurality of layers made of different materials may be sequentially disposed by means of a thin film deposition process such as chemical vapor deposition (CVD), physical vapor deposition (PVD), atomic layer deposition (ALD) or any combination thereof, to form the substrate 100'.

The substrate 100' may comprise a substrate sacrificial layer (not shown) for subsequently forming a semiconductor connection layer (for example, forming a second semiconductor layer, etc. in a subsequent step). The substrate sacrificial layer may comprise single layers, multiple layers or suitable composite layers. For example, the substrate sacrificial layer may comprise any one or more of a silicon oxide layer, a silicon nitride layer, and a silicon oxynitride layer. As an option, the substrate sacrificial layer may be a high dielectric constant dielectric layer. As another option, the substrate sacrificial layer may comprise a first dielectric layer (not shown), a sacrificial layer (not shown) and a second dielectric layer (not shown) which are sequentially disposed, where the first dielectric layer and the second dielectric layer may be silicon nitride layers, and the sacrificial layer may be a silicon oxide layer. Optionally, the material of the sacrificial layer can also be single crystalline silicon or polysilicon. Specifically, in an implementation of the present disclosure, an exemplary material for making the sacrificial layer may be polysilicon. As another option, the substrate sacrificial layer may comprise any one or more of a dielectric material, a semiconductor material, and a conductive material.

Some regions of the substrate 100' may also form wells doped with an N-type or P-type dopant by means of an ion implantation or diffusion process. The dopant may comprise any one of phosphorus (P), arsenic (As), and stibium (Sb) or any combination thereof. In some implementations of the present disclosure, the wells may be fabricated from identical or different dopants; furthermore, the wells may have identical or different doping concentrations, which will not be limited in the present disclosure.

The substrate 100' comprises a first surface 110 and a second surface, which are opposite to each other. The first surface 110 defines at least one memory plane region. The memory plane region may comprise a first region 11' located at the edge and a second region 22' different from the first region 11'.

After the substrate 100' is formed, the dielectric stack structure 200' may be formed on the first surface 110 by means of one or more thin film deposition processes. The thin film deposition processes may include but are not limited to chemical vapor deposition (CVD), physical vapor deposition (PVD), atomic layer deposition (ALD) or any combined thin film deposition processes thereof, or any combination thereof, which will not be limited in the present disclosure.

The dielectric stack structure 200' may comprise a plurality of pairs of alternately stacked first dielectric layers 210 and second dielectric layers 220. For example, the dielectric stack structure 200' may comprise 64 pairs, 128 pairs or more than 128 pairs of first dielectric layers 210 and second dielectric layers 220.

In other words, the dielectric stack structure 200' may comprise a plurality of dielectric layer pairs formed by the first dielectric layers 210 and the second dielectric layers 22, which are stacked in the first direction (z-direction). In some implementations, the first dielectric layers 210 and the second dielectric layers 220 may each comprise a first dielectric material and a second dielectric material different from the first dielectric material. Exemplary materials for making the first dielectric layers 210 and the second dielectric layers 220 may each comprise silicon oxide and silicon nitride. The silicon oxide layer may be used as an isolation stack layer, while the silicon nitride layer may be used as a sacrificial stack layer. Then, the sacrificial stack layer may be etched away, and the sacrificial stack layer etched away may be replaced by a gate layer comprising a conductive material.

The fabrication method of a single dielectric stack structure is described above. In fact, with the increasing demand for storage capacity of semiconductor devices, the memory stack layer enlarges gradually. In order to break through the limitation of process limit, a plurality of sub-dielectric stack structures stacked sequentially in the z direction of a dielectric stack structure are formed by means of the double-stack technology or multiple-stack technology to form the dielectric stack structure, where each sub dielectric stack structure may comprise a plurality of alternately stacked first dielectric layers and second dielectric layers. Each sub-dielectric stack structure may have an identical or different number of layers. Since the content and structure involved in the fabrication process of a single dielectric stack structure described above can be fully or partially applicable to the dielectric stack structure formed by the plurality of sub-dielectric stack structures of which the technical effect is described here, the content related or similar thereto will not be repeated here. However, those skilled in the art can understand that the subsequent fabrication process may be performed on the basis of multiple dielectric stack structures or a single dielectric stack structure.

Step S2

Referring to FIG. 4 to FIG. 5C again, step S2 of forming first contact holes and second contact holes penetrating through the dielectric stack structure in the first direction and extending to the substrate respectively in the parts of the dielectric stack structure corresponding to the first region and the second region, where the first contact holes and the second contact holes are formed from the same mask, for example may comprise, for example, forming a plurality of stepped staircases in the part of the dielectric stack structure 200' corresponding to the second region 22' and forming a covering dielectric layer 230 on the stepped staircases; and forming the first contact holes 610 in the part of the dielectric stack structure 200' corresponding to the first region 11', and forming the second contact holes 510 penetrating through the covering dielectric layer 230 and the stepped staircases in the z direction in the part of the dielectric stack structure 200' corresponding to the second region 22' from the same mask (not shown).

Specifically, forming a plurality of stepped staircases in the part of the dielectric stack structure 200' corresponding to the second region 22' may be realized by performing a plurality of trimming-etching cycles on, for example, the dielectric stack structure 200'. By performing a plurality of "trimming-etching" cycles, the dielectric stack structure 200' can have one or more inclined edges and a top (away from the substrate 100') dielectric layer pair that is shorter than the bottom (close to the substrate 100') dielectric layer pair. Any suitable etching process (including any or a combination of a dry etching process and a wet etching process) may be used in the stepped staircases formation process.

After forming a plurality of stepped staircases, the part of the dielectric stack structure 200' corresponding to the second region 22' is divided into memory region 01 and staircase region 02 in the x direction. Optionally, the part of the dielectric stack structure 200' corresponding to the first region 11' may comprise a first region 12' distributed in a third direction (y direction) with the memory region 01. The first contact holes 610 are formed in the first region 12', and the second contact holes 510 are formed in the stepped regions 02 by, for example, performing a dry etching process or a combination of a dry etching process and a wet etching process, or performing other manufacturing processes, such as patterning processes comprising photoetching, cleaning, chemical mechanical polishing, etc.

Optionally, in order to simplify the fabrication processes of the semiconductor device and save production costs, the first contact holes 610 and the second contact holes 510 may be formed from the same mask in the same fabrication procedure. For example, a photoresist mask layer (not shown) is formed on a surface of the dielectric stack structure 200' away from the substrate 100'; a first contact hole pattern (not shown) and a second contact hole pattern (not shown) are formed in the photoresist mask layer by means of the same mask; the dielectric stack structure 200' is etched through the first contact hole pattern and the second contact hole pattern to form the first contact holes 610 and the second contact holes 510 respectively. The above etching process may comprise a dry etching process or a combination of a dry etching process and a wet etching process; or may comprise other manufacturing processes, such as cleaning, chemical mechanical polishing, etc.

As an option, a channel hole 310 penetrating through the dielectric stack structure 200' in the z direction may be formed in the memory region 01 in the procedure of forming the first contact hole. Specifically, in order to simplify the fabrication processes of the semiconductor device and save production costs, the channel hole 310, the first contact holes 610, and the second contact holes 510 may be formed from the same mask in the same fabrication procedure. Optionally, the channel hole 310, the first contact hole 610, and the second contact hole 510 may have the same depth in the z-direction.

After forming the channel holes 310, the first contact holes 610, and the second contact holes 510, the fabrication method 2000 of the semiconductor device may further comprise: forming channel structures 300; forming gate line slit structures 400; forming gate layers 250; and forming first contact structures 600 and second contact structures 500.

Figure 6A:
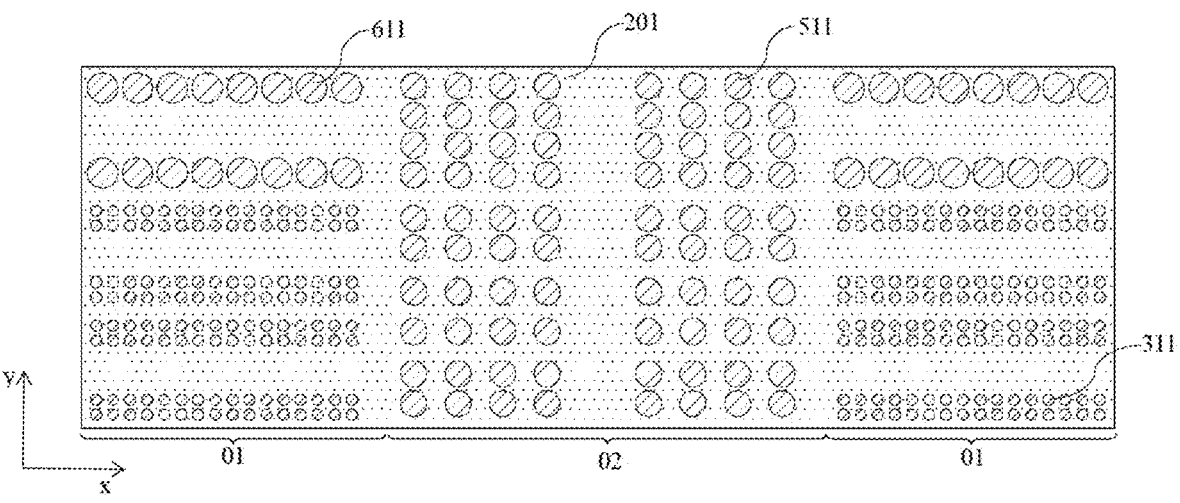
Figure 6B:
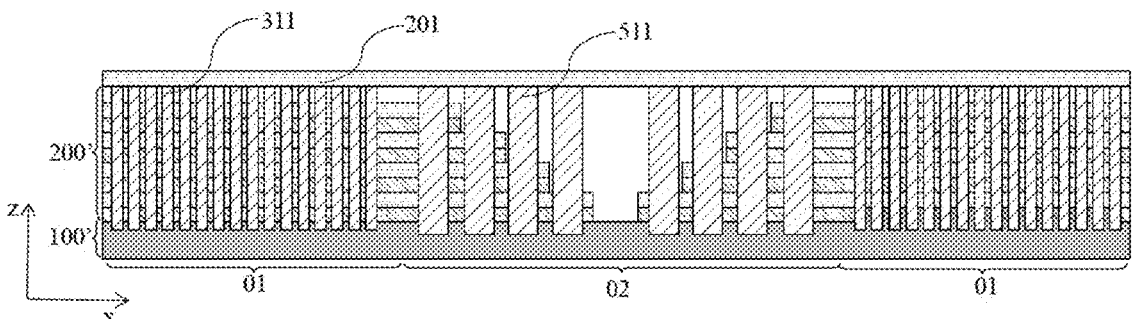
Figure 7A:
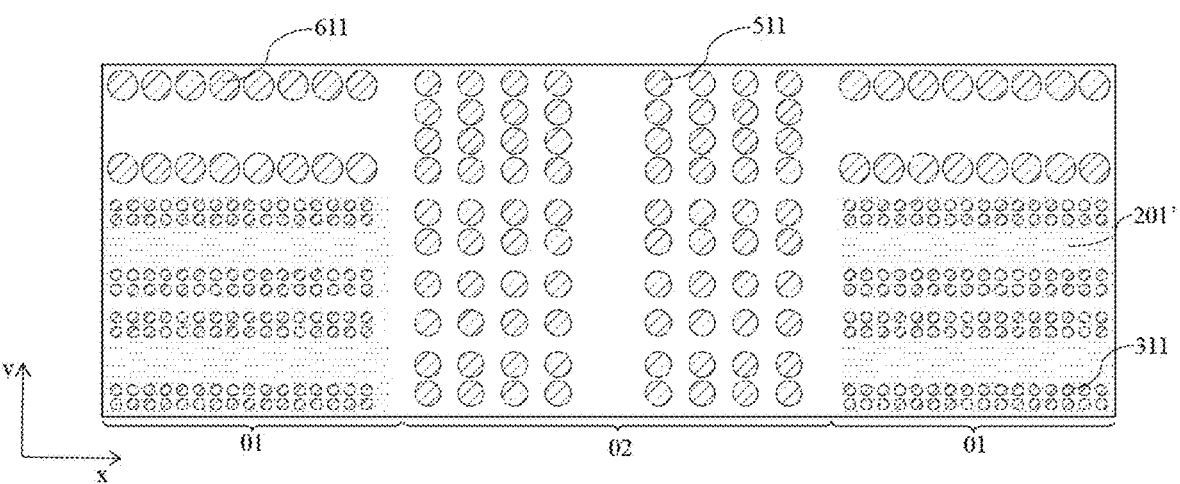
Figure 7B:
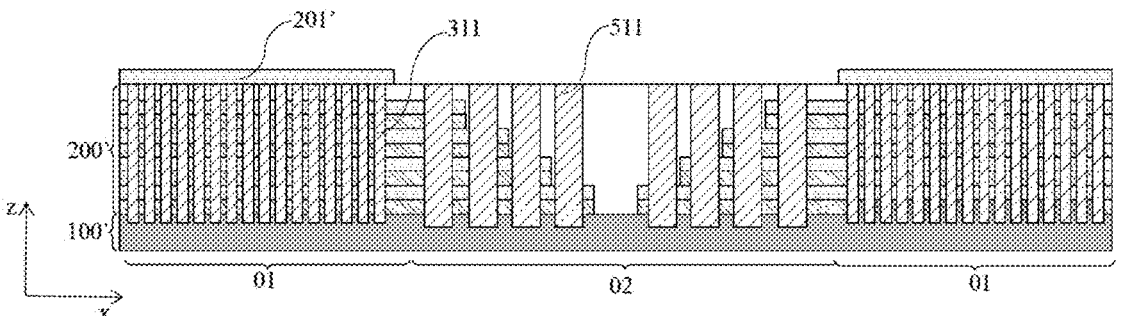
Figure 8A:
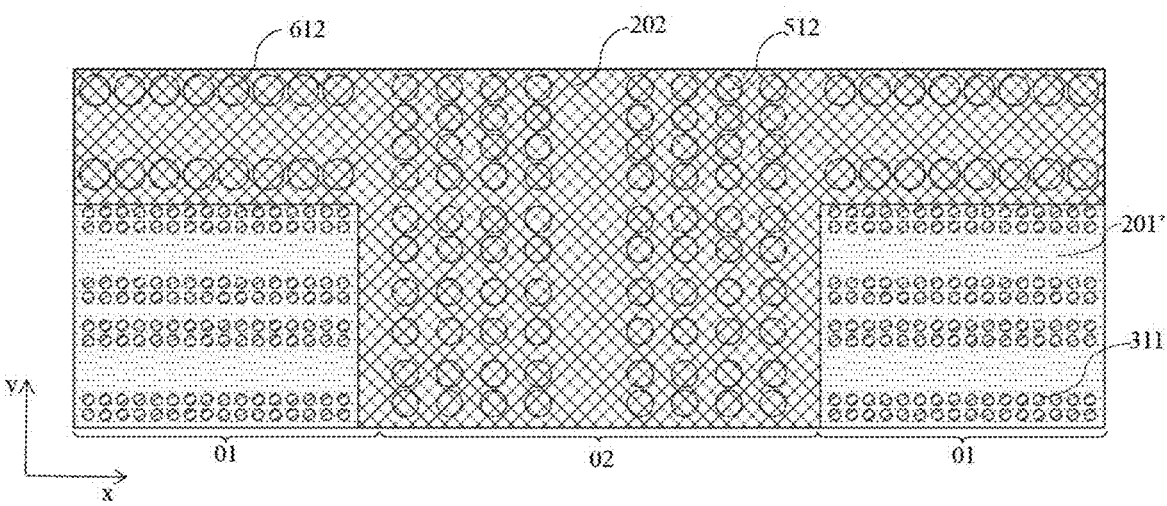
Figure 8B:
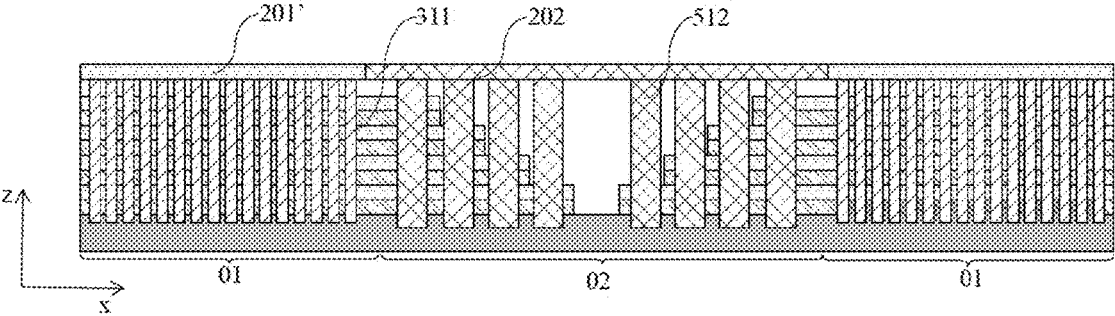
Figure 9A:
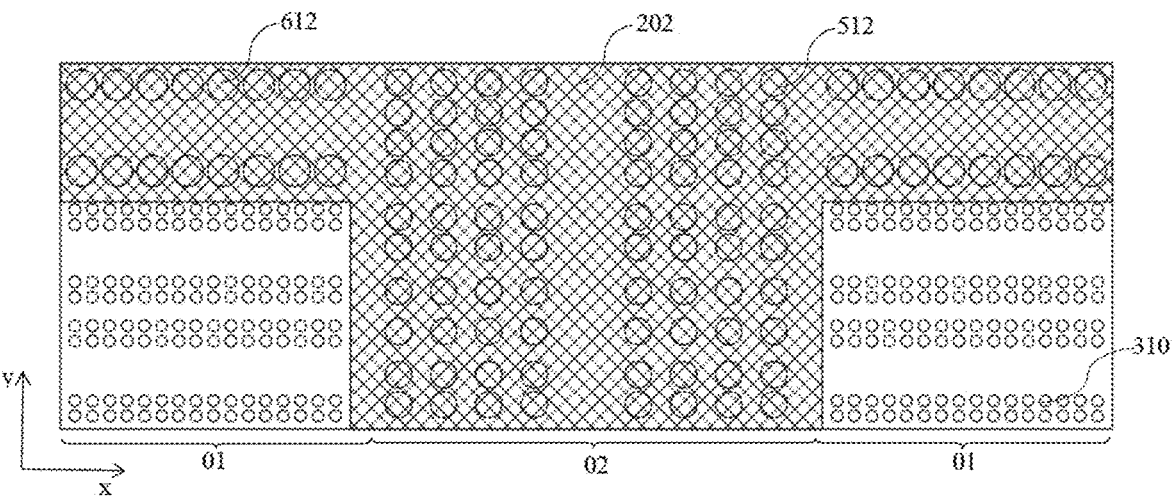
Figure 9B:
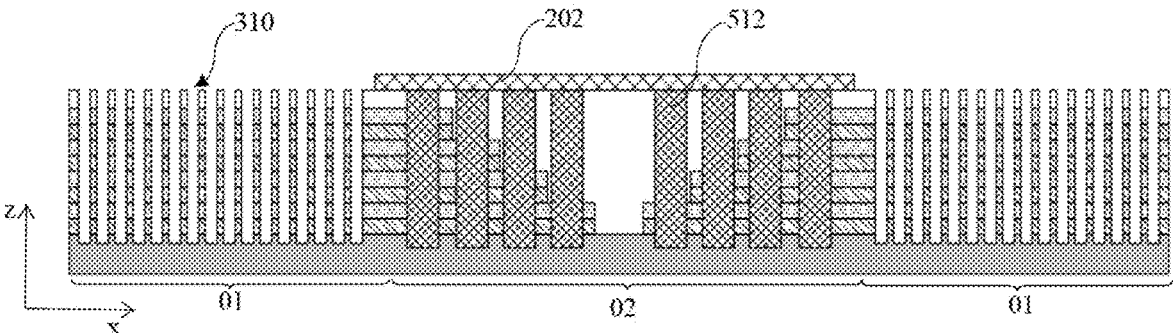
Figure 10A:
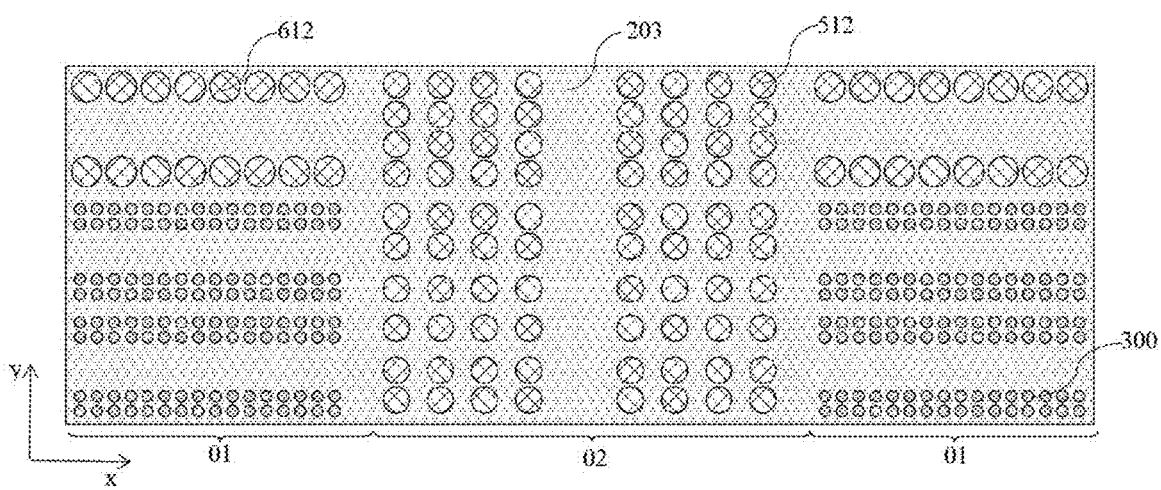
Figure 10B:
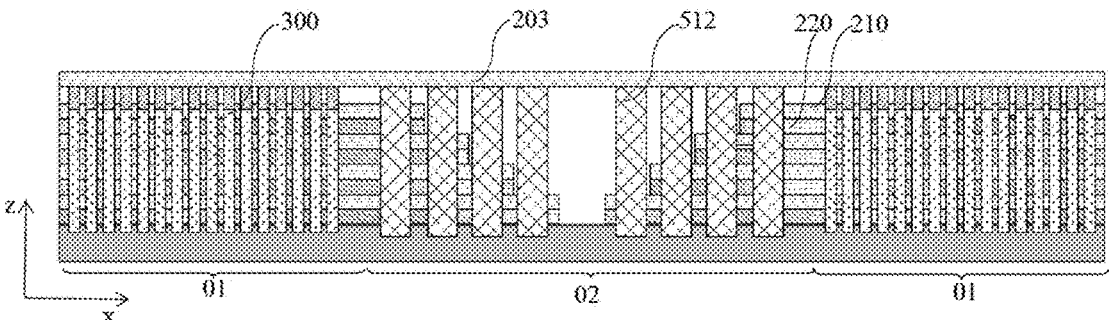

FIG. 6A is a schematic top view of a structure formed after forming a first sacrificial layer 201, according to an implementation of the present disclosure. FIG. 6B is a schematic cross-sectional view of a structure formed after forming a first sacrificial layer 201, according to an implementation of the present disclosure. FIG. 7A is a schematic top view of a structure formed after forming a part of a first sacrificial layer 201' according to an implementation of the present disclosure. FIG. 7B is a schematic cross-sectional view of a structure formed after forming a part of a first sacrificial layer 201' according to an implementation of the present disclosure. FIG. 8A is a schematic top view of a structure formed after forming a second sacrificial layer 202 according to an implementation of the present disclosure. FIG. 8B is a schematic cross-sectional view of a structure formed after forming a second sacrificial layer 202, according to an implementation of the present disclosure. FIG. 9A is a schematic top view of a structure formed after removing part of the first sacrificial layer 201' according to an implementation of the present disclosure. FIG. 9B is a schematic cross-sectional view of a structure formed after removing part of the first sacrificial layer 201' according to an implementation of the present disclosure. FIG. 10A is a schematic top view of a structure formed after forming a channel structure 300 according to an implementation of the present disclosure. FIG. 10B is a schematic cross-sectional view of a structure formed after forming a channel structure 300 according to an implementation of the present disclosure.

As shown in FIG. 6A to FIG. 10B, forming the channel structure 300 may comprise, for example, filling the channel hole 310, the first contact hole 610 and the second contact hole 510 with a first sacrificial material, and forming a first sacrificial layer 201 covering the top surface of the dielectric stack structure 200' away from the substrate 100' (see FIG. 6B); removing part of the first sacrificial layer 201 located above the first contact hole 610 and the second contact hole 510, and removing the first sacrificial material in the first contact hole 610 and the second contact hole 510 to form part of a first sacrificial layer 201' (see FIG. 7B); and filling the first contact hole 610 and the second contact hole 510 with a first dielectric material, and forming a second sacrificial layer 202 above the first contact hole 610 and the second contact hole 510 (see FIG. 8B); removing part of the first sacrificial layer 201', and removing the first sacrificial material located in the channel hole 310 (see FIG. 9B); and forming a channel structure 300 in the channel hole 310 (see FIG. 10B).

Specifically, as mentioned above, in order to simplify the fabrication processes of the semiconductor device and save production costs, the channel hole 310, the first contact hole 610, and the second contact hole 510 may be formed from the same mask in the same fabrication procedure. Therefore, in the procedure of forming the channel structure 300, it is necessary to shield the formed first contact hole 610 and second contact hole 510.

Optionally, the first sacrificial material may be carbon. In addition, other materials can also be selected, which will not be limited to the present disclosure. Because each layer formed based on the first sacrificial material needs to be removed in the subsequent process, a material with a relatively fast forming process, low preparation cost, and easy removal is selected as the first sacrificial material, and damage to the dielectric stack structure in the procedure of removing the first sacrificial material is avoided.

As shown in FIG. 6A to FIG. 6B, the channel hole 310, the first contact hole 610, and the second contact hole 510 may be filled with a first sacrificial material by means of one or more thin film deposition processes, to form a channel hole sacrificial layer 311, a first contact hole sacrificial layer 611 and a second contact hole sacrificial layer 511, and form a first sacrificial layer 201 covering the top surface of the dielectric stack structure 200'. The thin film deposition processes may include but are not limited to chemical vapor deposition (CVD), physical vapor deposition (PVD), atomic layer deposition (ALD), or any combined thin film deposition processes thereof, or any combination thereof, which will not be limited in the present disclosure.

In addition, planarization treatment may be performed on the first sacrificial layer 201. For example, planarization treatment such as chemical-mechanical polishing (Buffer CMP) with a low grinding rate may be performed on the surface of the first sacrificial layer 201. Through planarization treatment, it is easier to make the first sacrificial layer 201 have a planarized surface, thereby facilitating the subsequent removal of a part of the first sacrificial layer 201.

As shown in FIG. 7A to FIG. 7B, a part of the first sacrificial layer 201 located above the first contact hole 610 and the second contact hole 510, and the first sacrificial material located in the first contact hole 610 and the second contact hole 510 can be removed by ashing treatment to form a part of the first sacrificial layer 201'. Ashing treatment may not have by-product residues, and may not damage the dielectric stack structure.

As shown in FIG. 7A to FIG. 8B, the first contact hole 610 and the second contact hole 510 may be filled with a first dielectric material layer by means of one or more thin film deposition processes, to form an auxiliary support structure 612 and a dummy channel structure 512, and form a second sacrificial layer 202 above the auxiliary support structure 612 and the dummy channel structure 512. The thin film deposition processes may include but are not limited to chemical vapor deposition (CVD), physical vapor deposition (PVD), atomic layer deposition (ALD), or any combined thin film deposition processes thereof, or any combination thereof.

In addition, planarization treatment may be performed on the second sacrificial layer 202 and a part of the first sacrificial layer 201'. For example, planarization treatment such as chemical-mechanical polishing (Buffer CMP) with a low grinding rate may be performed on the surfaces of the second sacrificial layer 202 and part of the first sacrificial layer 201. Through planarization treatment, it is easier to make part of the first sacrificial layer 201 and the second sacrificial layer 202 have conformal planarized surfaces, thereby facilitating the implementation of subsequent fabrication processes.

After the channel structure is formed, the second dielectric layer may be removed through a gate line slit in the dielectric stack structure, and the gate layer can be formed by a gate-last process. However, after the second dielectric layer is removed, the dielectric stack structure is prone to collapse, and a dummy channel structure is usually needed to support the dielectric stack structure. With the continuous development of semiconductor devices towards the direction of multiple layers and high densities, the number of dummy channel structures is increasing, and the proportion of dummy channel structures in the effective memory region of a semiconductor device is increasing. In addition, one or more dummy channel structures are usually disposed around the second contact structure in the staircase region. In the procedure of fabricating the semiconductor device, due to reasons such as internal stress distribution, etc., a critical dimension of a gate line slit in a plane perpendicular to the z direction may be enlarged, and then the dummy channel hole where the dummy channel is located may be squeezed towards the direction of the second contact hole, causing the second contact hole to overlap with the dummy channel hole. Such high overlapping risk may cause the problem of current leakage, thus affecting the electrical performance of the finally formed semiconductor device and deteriorating the reliability thereof.

In the fabrication method of the semiconductor device provided by at least one implementation of the present disclosure, no dummy channel hole and dummy channel structure are separately formed, but a first contact hole and a second contact hole are formed in advance in the procedure of forming the channel hole, and a dummy channel structure and an auxiliary support structure are formed in the first contact hole and the second contact hole by using a first dielectric material layer through the fabrication process described above, so as to provide support for the dielectric stack structure in the subsequent process of forming the gate layer. After the gate layer is formed, the auxiliary support structure and the dummy channel structure in the first contact hole and the second contact hole can also be removed respectively to form a first contact structure and a second contact structure, so that the storage density per unit area of the semiconductor device can be improved and the electrical performance and reliability of the semiconductor device can be improved while providing support for the dielectric stack structure.

Optionally, the first dielectric material layer may comprise a semiconductor material layer, such as a polysilicon material layer. A dummy channel structure 512 and an auxiliary support structure 612 are formed by using the semiconductor material layer, which can reduce the stress deformation of the dielectric stack structure caused by the thermal effect in the subsequent fabrication process of the semiconductor device. In addition, the first dielectric material layer may be of a structure of single layers, multiple layers or suitable composite layers, or the like. Optionally, in the filling process, a plurality of gaps may be formed in the auxiliary support structure 612 and the dummy channel structure 512 by controlling the channel filling process to relieve the structural stress. It can be understood by those skilled in the art that the materials, structures, and fabrication processes of forming the dummy channel structure and the auxiliary support structure may be selected according to actual needs, which will not be limited in the present disclosure.

In conjunction with FIG. 3, FIG. 8A to FIG. 10B, after the dummy channel structure 512 and the auxiliary support structure 612 are formed, part of the first sacrificial layer 201' and the channel hole sacrificial layer 311 may be removed by, for example, performing a dry etching process or a combination of a dry etching process and a wet etching process, or performing other manufacturing processes, such as patterning processes comprising photoetching, cleaning, chemical mechanical polishing, etc.

A functional layer 320 and a channel layer 330 are sequentially formed on the inner wall of a re-exposed channel hole 310 by means of thin film deposition processes such as chemical vapor deposition (CVD), physical vapor deposition (PVD), atomic layer deposition (ALD) or any combination thereof.

Specifically, the functional layer 320 may comprise a blocking layer (not shown) formed on the inner wall of the channel hole 310 to block the outflow of charges; a charge trap layer (not shown) formed on the surface of the blocking layer to store charges during the operation of the three-dimensional memory; and a tunneling layer (not shown) formed on the surface of the charge trap layer.

In some implementations, the functional layer 320 may comprise an oxide-nitride-oxide (ONO) structure. However, in some other implementations, the functional layer 320 may also have a structure different from the ONO configuration. The channel layer 330 can be used to transport required charges (electrons or holes). However, those skilled in the art should understand that the channel structure 300 can be set according to different three-dimensional memory architectures without departing from the teaching of the present disclosure, which will not be limited to the present disclosure.

For example, as an option, the functional layer 320 may be formed on the sidewall and bottom surface of the channel hole 310, and the channel layer 330 may be formed on the surface of the tunneling layer in the functional layer 320 by means of thin film deposition processes such as chemical vapor deposition (CVD), physical vapor deposition (PVD), atomic layer deposition (ALD) or any combination thereof.

As another option, the functional layer 320 may be formed only on the sidewall of the channel hole 310, and the channel layer 330 may be formed on the surface of the tunneling layer of the functional layer 320 and, for example, on the surface of the epitaxial layer subsequently formed on the bottom surface of the channel hole 310 by means of thin film deposition processes such as chemical vapor deposition (CVD), physical vapor deposition (PVD), atomic layer deposition (ALD) or any combination thereof.

Specifically, an epitaxial layer (not shown) may first be formed on the bottom of the channel hole 310 by means of an epitaxial growth process, where the manufacturing processes for epitaxially growing the epitaxial layer may include, but are not limited to, vapor phase epitaxy (VPE), liquid phase epitaxy (LPE), molecular beam epitaxy (MPE) or any combination thereof. The epitaxial layer may be at least one of epitaxial silicon, silicon germanium, germanium, III-V compound material, II-VI compound material, organic semiconductor material and other suitable semiconductor materials. After the epitaxial layer is formed, an initial functional layer (not shown) may be formed on the inner wall of the channel hole 310 and the surface of the epitaxial layer by performing thin film deposition processes such as chemical vapor deposition (CVD), physical vapor deposition (PVD), atomic layer deposition (ALD) or any combination thereof, then the part of the initial functional layer located on the surface of the epitaxial layer may be removed by, for example, performing a dry etching process or a combination of a dry etching process and a wet etching process, or performing other manufacturing processes, such as patterning processes comprising photoetching, cleaning, chemical mechanical polishing, etc., and a part of the surface of the epitaxial layer is exposed. It can be understood that the functional layer 320 is formed only on the sidewall of the channel hole 310. After the functional layer 320 is formed, a channel layer 330 connected with the epitaxial layer may be formed on the surface of the tunneling layer of the functional layer 320 and the exposed surface of the epitaxial layer by means of thin film deposition processes such as chemical vapor deposition (CVD), physical vapor deposition (PVD), atomic layer deposition (ALD) or any combination thereof.

In some implementations, the channel layer 330 may comprise silicon, such as polysilicon or single crystalline silicon. The material of the channel layer 330 may include but is not limited to N-type doped polysilicon. Similar to the channel hole 310, the channel layer 330 may also pass through the dielectric stack structure 200' and have a cylinder or pillar shape. As an option, the channel layer 330 may also extend into the substrate 100'.

In addition, the channel structure 300 further comprises a channel plug (not shown) formed at one end (which can be understood as the top end of the channel structure 300) of the channel hole 310 away from the substrate 100'. Specifically, after the channel layer 330 is formed, the remaining part of the channel hole 310 may be filled with a channel hole filling dielectric layer (not shown). The channel hole filling dielectric layer may comprise an oxide dielectric layer, such as silicon oxide, etc. Furthermore, in the filling process, a plurality of insulation gaps may be formed in the channel hole filling dielectric layer by controlling the channel filling process to relieve the structural stress. Then, a channel plug is formed in the part of the channel hole filling dielectric layer located at the top of the channel hole 310. The channel plug may be made of the same material as the channel layer 330, such as N-type doped polysilicon, etc. The channel plug is electrically connected with the channel layer 330.

After the channel structure 300 is formed, the second sacrificial layer 202 may be removed by, for example, performing a dry etching process or a combination of a dry etching process and a wet etching process, or performing other manufacturing processes, such as patterning processes comprising photoetching, cleaning, chemical mechanical polishing, etc. A top surface dielectric covering layer 203 covering the channel structure 300, the dummy channel structure 512, and the auxiliary support structure 612 is formed by means of thin film deposition processes such as chemical vapor deposition (CVD), physical vapor deposition (PVD), atomic layer deposition (ALD) or any combination thereof.

In addition, planarization treatment may be performed on the top surface dielectric covering layer 203. For example, planarization treatment such as chemical-mechanical polishing (Buffer CMP) with a low grinding rate may be performed on the surface of the top surface dielectric covering layer 203. Through planarization treatment, it is easier to make the top surface dielectric covering layer 203 have a planarized surface, thereby facilitating the implementation of subsequent fabrication processes.

Figure 11A:
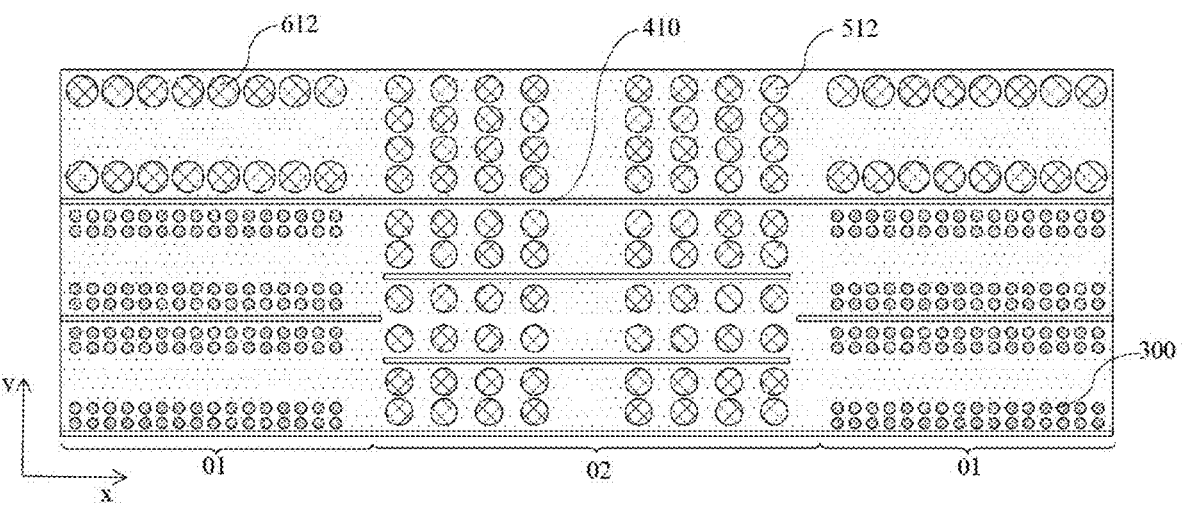
Figure 11B:
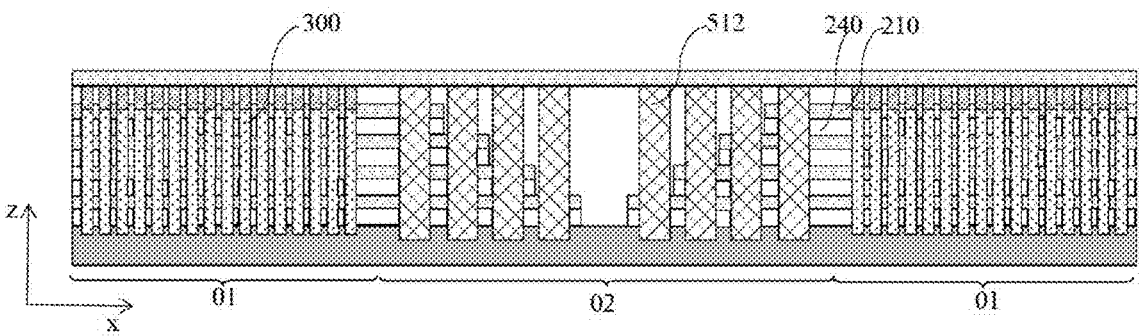
Figure 12A:
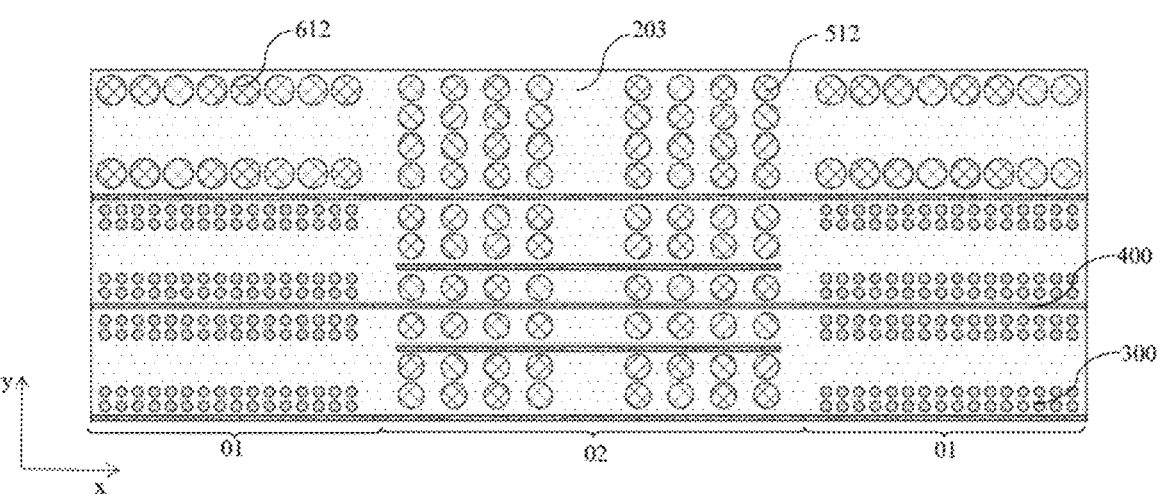
Figure 12B:
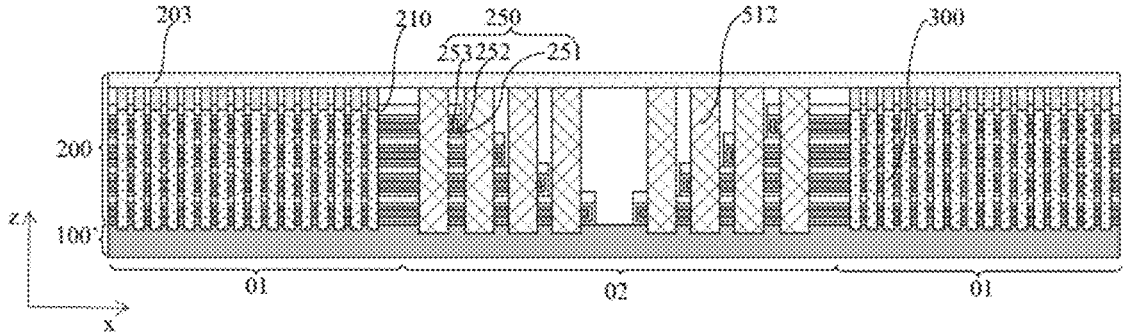
Figure 13A:
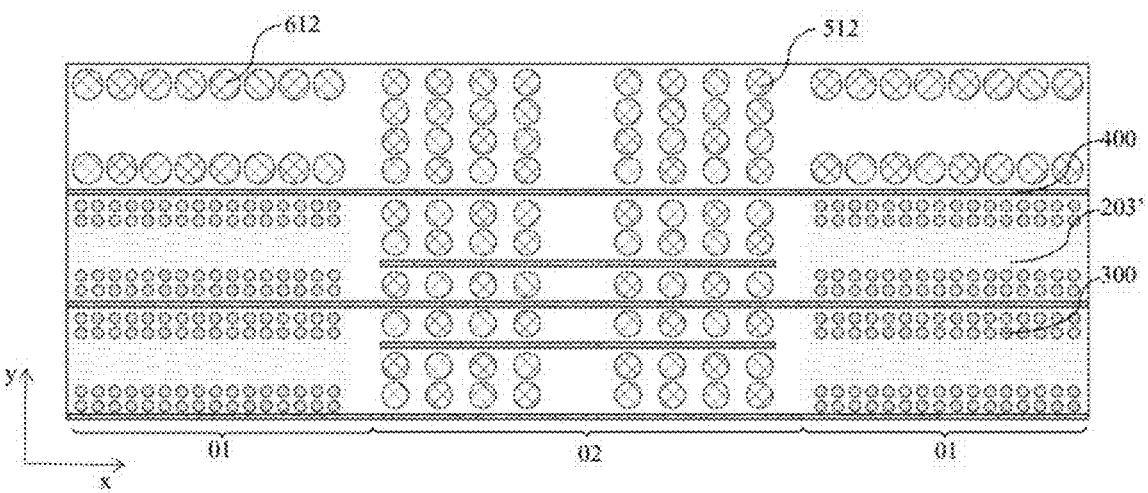
Figure 13B:
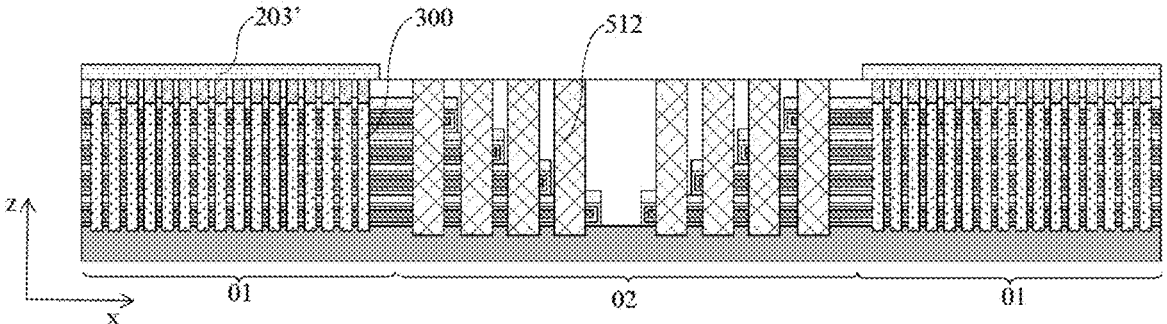

FIG. 11A is a schematic top view of a structure formed after forming a gate line slit 410 according to an implementation of the present disclosure. FIG. 11B is a schematic cross-sectional view of a structure formed after forming a gate line slit 410 according to an implementation of the present disclosure. FIG. 12A is a schematic top view of a structure formed after forming a gate layer 250 according to an implementation of the present disclosure. FIG. 12B is a schematic cross-sectional view of a structure formed after forming a gate layer 250 according to an implementation of the present disclosure. FIG. 13A is a schematic top view of a structure formed after forming a part of a top surface dielectric covering layer 203' according to an implementation of the present disclosure. FIG. 13B is a schematic cross-sectional view of a structure formed after forming a part of a top surface dielectric covering layer 203' according to an implementation of the present disclosure.

As shown in FIG. 10A to FIG. 13B, forming the gate layer 250 may comprise, for example, forming a gate line slit 410; removing the second dielectric layers 220 through the gate line slit 410 to form a sacrificial gap 240; forming a gate layer 250 comprising a gate conductor layer 253 in the sacrificial gap 240; and forming a part of a top surface dielectric covering layer 203'.

As shown in FIG. 10A to FIG. 11B, the gate line slit 410 may be formed by, for example, performing a dry etching process or a combination of a dry etching process and a wet etching process, or performing other manufacturing processes, such as patterning processes comprising photoetching, cleaning, chemical mechanical polishing, etc.

As an option, the gate line slit 410 may extend through the memory region 01 and the staircase region 02 in the x direction. As another option, the gate line slit 410 may also extend intermittently in the x direction. As with other options, some of a plurality of gate line slits 410 may extend through the memory region 01 only in the x direction; and some of the plurality of gate line slits 410 may extend through the staircase region 02 only in the x direction.

As shown in FIG. 10A to FIG. 12B, the gate line slit 410 can be used as a channel (process window) for providing an etchant and a chemical precursor. The second dielectric layers 220 is removed by means of processes such as wet etching, etc. to form a sacrificial gap 240 for accommodating the gate layer. Through the gate line slit 410, the sacrificial gap 240 may be filled to form a gate layer 250.

The gate layer 250 may comprise an inter-wall dielectric layer 251, an adhesive layer 252, and a gate conductor layer 253. The inter-wall dielectric layer 251 may be located between the first dielectric layers 210 and the gate conductor layer 253. As an option, the inter-wall dielectric layer 251 may be a high dielectric constant dielectric layer; and the adhesive layer 252 may be located between the first dielectric layers 210 and the gate conductor layer 253 or between the inter-wall dielectric layer 251 and the gate conductor layer 253, and the adhesive layer may be, for example, a titanium nitride (TiN) layer.

An initial inter-wall dielectric layer (not shown), an initial adhesive layer (not shown), and an initial gate conductor layer (not shown) are sequentially formed in the gate line slit 410 and the sacrificial gap 240 by means of thin film deposition processes such as chemical vapor deposition (CVD), physical vapor deposition (PVD), atomic layer deposition (ALD) or any combination thereof. Then, the parts of the initial gate conductor layer, the initial adhesive layer, and the initial inter-wall dielectric layer located in the gate line slit 410 are sequentially removed by, for example, performing a dry etching process or a combination of a dry etching process and a wet etching process, or performing other manufacturing processes, such as patterning processes comprising photoetching, cleaning, chemical mechanical polishing, etc. for many times, thereby forming the gate layer 250.

As shown in FIG. 12A to FIG. 13B, after the gate layer 250 is formed, the gate line slit 410 can also be filled by means of thin film deposition processes such as chemical vapor deposition (CVD), physical vapor deposition (PVD), atomic layer deposition (ALD) or any combination thereof to form a gate line slit structure 400.

Optionally, insulation dielectric materials such as silicon oxide, silicon nitride, and silicon oxynitride can be selected, or semiconductor materials such as polysilicon can be selected to fill the gate line slit 410, which will not be limited in the present disclosure. After the gate line slit structure 400 is formed, the dielectric stack structure 200' is formed as a stack structure 200.

In addition, the part of the top surface dielectric covering layer 203 covering the dummy channel structure 512 and the auxiliary support structure 612 may be removed by, for example, performing a dry etching process or a combination of a dry etching process and a wet etching process, or performing other manufacturing processes, such as patterning processes comprising photoetching, cleaning, chemical mechanical polishing, etc., to form a part of a top surface dielectric covering layer 203'.

Figure 14A:
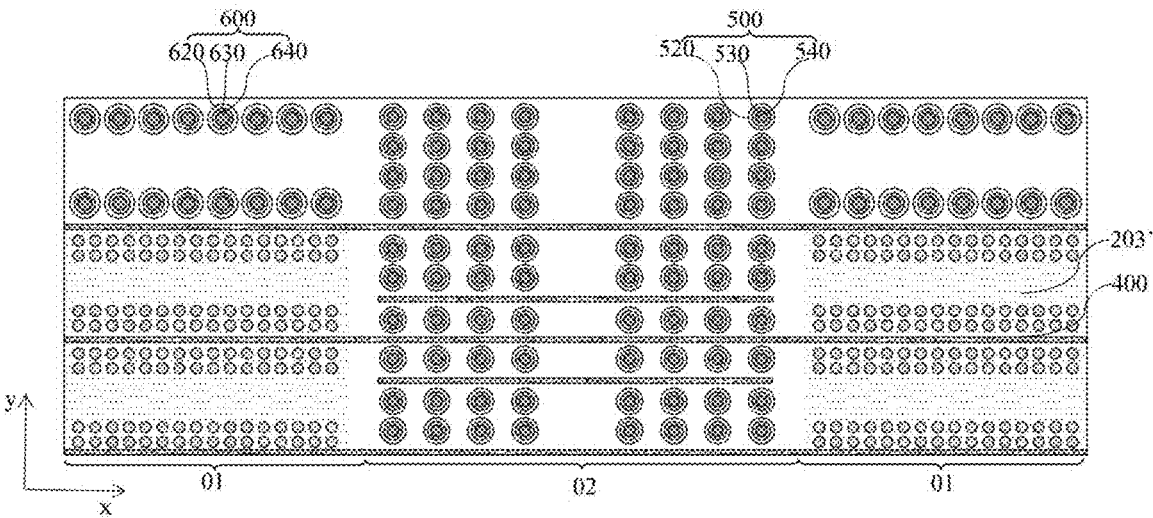
Figure 14B:
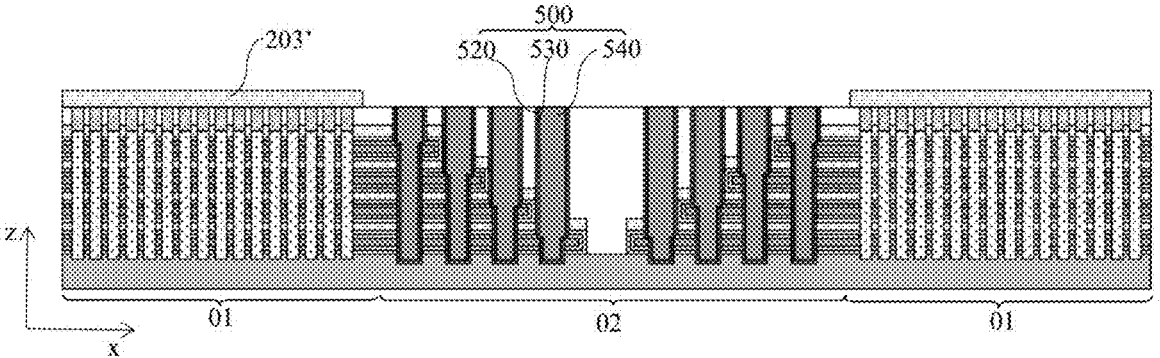

FIG. 14A is a schematic top view of a structure formed after forming a first contact structure 600 and a second contact structure 500 according to an implementation of the present disclosure. FIG. 14B is a schematic cross-sectional view of a structure formed after forming a first contact structure 600 and a second contact structure 500 according to an implementation of the present disclosure.

As an option, in some implementations of the present disclosure, the first contact structure 600 and the second contact structure 500 may be formed separately. As another option, in some implementations of the present disclosure, in order to simplify the fabrication processes of the semiconductor device and save production costs, the first contact structure 600 and the second contact structure 500 can be formed in the same fabrication procedure. The following describes the fabrication process of the first contact structures 600 and the second contact structures 500 by taking the formation of the first contact structure 600 and the second contact structure 500 in the same fabrication procedure as an example.

As shown in FIG. 1A, FIG. 1B, FIG. 14A and FIG. 14B, forming a first contact structure 600 and a second contact structure 500 may comprise: removing the first dielectric filling material layer (dummy channel structure 512) and refilling the second contact hole 510 to form a second contact structure 500 electrically connected with a corresponding gate conductor layer 253; removing the first dielectric filling material layer (auxiliary support structure 612) in the first contact hole 610 in the procedure of removing the first dielectric filling material in the second contact hole 510; and forming a first contact structure 600 in the procedure of forming the second contact structure 500.

As mentioned above, in the fabrication method of the semiconductor device provided by at least one implementation of the present disclosure, the dummy channel structure or the auxiliary support structure is only a transitional structure in the fabrication procedure, which provides support for the dielectric stack structure in the procedure of forming the gate layer. After the gate layer is formed, the auxiliary support structure and the dummy channel structure in the first contact hole and the second contact hole may be removed, respectively, so that the storage density per unit area of the semiconductor device can be improved and the electrical performance and reliability of the semiconductor device can be improved while providing support for the dielectric stack structure.

Specifically, the dummy channel structure 512 in the second contact hole 510 may be removed by, for example, performing a dry etching process or a combination of a dry etching process and a wet etching process, or performing other manufacturing processes, such as patterning processes comprising photoetching, cleaning, chemical mechanical polishing, etc. In this fabrication procedure, to simplify the fabrication processes of the semiconductor device and save production costs, the auxiliary support structure 612 in the first contact hole 610 can also be removed by means of the same processes.

In conjunction with FIG. 1B, FIG. 2 and FIG. 14B, the second contact hole 510 comprises a first hole 511 and a second hole 512. The first hole 511 is the part where the second contact hole 510 penetrates through the covering dielectric layer 230 in the z direction and extends to the upper surface 253-1 of the corresponding second dielectric layers 250, and the second hole 512 is the part where the second contact hole 510 penetrates through the stepped staircases in the z-direction. After removing the first dielectric filling material layer, forming the second contact structure 500 further comprises: enlarging the aperture of the first hole to at least make the aperture of the part of the first hole adjacent to the second hole larger than the aperture of the part of the second hole adjacent to the first hole.

Optionally, the aperture of the first hole 511 is enlarged by, for example, performing a dry etching process or a combination of a dry etching process and a wet etching process, or performing other manufacturing processes, such as patterning processes comprising photoetching, cleaning, chemical mechanical polishing, etc.

After enlarging the aperture of the first hole 511, the first contact hole 610 and the second contact hole 510 may be filled by means of thin film deposition processes such as chemical vapor deposition (CVD), physical vapor deposition (PVD), atomic layer deposition (ALD) or any combination thereof to form the first contact structure 600 and the second contact structure 500.

Specifically, the first portion 500-1 of the second contact structure 500 may be formed in the first hole 511, and the second portion 500-2 of the second contact structure 500 may be formed in the second hole 512. The part of the first portion 500-1 extending to the upper surface 253-1 of the corresponding gate conductor layer 253 extends in a plane perpendicular to the z direction, and is in contact with the upper surface 253-1.

Optionally, the first contact structure 600 comprises a first conductive core layer 640, a first adhesive layer 630, and a first blocking layer 620 sequentially from inside to outside. The second contact structure 500 comprises a second conductive core layer 540, a second adhesive layer 530, and a second blocking layer 520 sequentially from inside to outside, where the second blocking layer 520 comprises a first sub-layer 520-1 and a second sub-layer 520-2 between which a spacing exists in the z-direction. The second blocking layer 520 is divided into two parts between which a spacing exists in the z direction, and can ensure that the part of the first portion 500-1 extending to the upper surface 253-1 extends in a plane perpendicular to the z direction and is in effective contact with the upper surface 253-1. In addition, the second blocking layer 520 can also ensure that each second contact structure 500 is only electrically connected with a corresponding gate conductor layer 253.

In order to simplify the fabrication steps of the semiconductor device and reduce production costs, the first conductive core layer 640 and the second conductive core layer 540 may be made of the same material, the first adhesive layer 630 and the second adhesive layer 530 may be made of the same material, and the first blocking layer 620 and the second blocking layer 520 may be made of the same material.

In addition, after the first contact structure 600 and the second contact structure 500 are formed, a part of the top surface dielectric covering layer 203' is removed by, for example, performing a dry etching process or a combination of a dry etching process and a wet etching process, or performing other manufacturing processes, such as patterning processes comprising photoetching, cleaning, chemical mechanical polishing, etc.

According to the fabrication method of the semiconductor device provided by at least one implementation of the present disclosure, by disposing the first contact structure at the edge of a memory plane in the semiconductor device, the waste of effective memory region in the semiconductor device may be avoided, thereby improving the storage density per unit area of the semiconductor device. In addition, since the first contact structures penetrate through the stack structure and extend to the base, peripheral circuits may be combined on the front side and back side of the semiconductor device, improving the integration level and overall performance of the system comprising the semiconductor device.

In addition, the gate conductor layer may be selectively electrically connected to the first peripheral circuit located on the front side of the semiconductor device through the first portion of the second contact structure corresponding thereto, or electrically connected to the second peripheral circuit located on the back side of the semiconductor device through the second portion of the second contact structure corresponding thereto, thus providing an implementation basis for the combination of multiple peripheral circuit wafers and memory array wafers, further reducing the feature dimension of the system comprising the semiconductor device, and improving the integration level and overall performance of the system.

In addition, the dummy channel structure or the auxiliary support structure is only a transitional structure in the fabrication procedure, which provides support for the dielectric stack structure in the process of forming the gate layer. After the gate layer is formed, the auxiliary support structure and the dummy channel structure in the first contact hole and the second contact hole may be removed, respectively, and a first contact structure and a second contact structure are formed in the first contact hole and the second contact hole, so that the storage density per unit area of the semiconductor device can be improved and the electrical performance and reliability of the semiconductor device can be improved while providing support for the dielectric stack structure.

Figure 15:
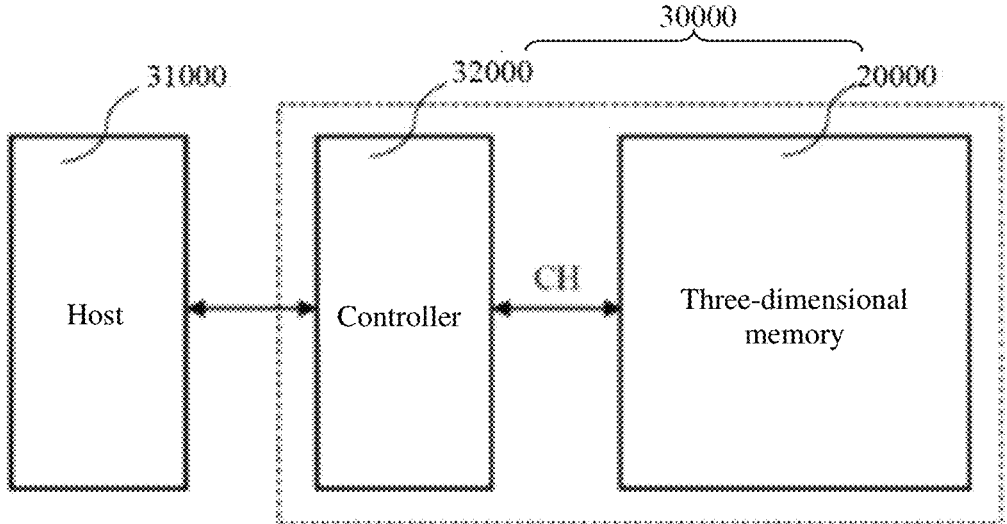
FIG. 15 is a structural diagram of a memory system according to an implementation of the present disclosure.

FIG. 15 is a structural diagram of a memory system 30000 according to an implementation of the present disclosure.

As shown in FIG. 15, at least one implementation in another aspect of the present disclosure further provides a memory system 30000. The memory system 30000 may comprise a semiconductor device 20000 and a controller 32000. The semiconductor device 20000 can be the same as the semiconductor device described in any one of the above implementations, which will not be described in detail in the present disclosure.

Optionally, the semiconductor device 20000 may be a memory array wafer or a memory comprising a peripheral circuit. Specifically, the semiconductor device 20000 may comprise at least one of a two-dimensional memory or a three-dimensional memory. As an option, the three-dimensional memory may comprise at least one of a three-dimensional NAND memory and a three-dimensional NOR memory.

Specifically, the memory system 30000 may comprise a semiconductor device 20000 and a controller 32000. The semiconductor device 20000 can be the same as the semiconductor device described in any one of the above implementations, which will not be described in detail in the present disclosure. The controller 32000 may control the semiconductor device 20000 through a channel CH, and the semiconductor device 20000 may perform an operation based on the control of the controller 32000 in response to a request from a host 31000. The semiconductor device 20000 may receive a command CMD and an address ADDR from the controller 32000 through the channel CH and access the region selected from the memory cell array in response to the address. In other words, the semiconductor device 20000 may perform an internal operation corresponding to the command on the region selected in response to the address.

In some implementations, the memory system may be implemented as, for example, a universal flash storage (UFS) device, a solid-state disk (SSD), a multimedia card (MMC, eMMC, RS-MMC, mini-MMC), a secure digital card (SD, mini-SD, microSD), a personal computer memory card international association (PCMCIA) card type storage device, a peripheral component interconnect (PCI) type storage device, a PCI-Express (PCI-E) type storage device, a compact flash (CF) card, a smart media card or a memory stick, etc. The memory system provided by the present disclosure has the same beneficial effects as the three-dimensional memory because of being provided with the three-dimensional memory provided by the present disclosure, which are not repeated herein.

The above description is only a description of the preferred implementation of the present disclosure and of the technical principles employed. It should be understood by those skilled in the art that the scope of protection referred to in this application is not limited to technical solutions formed by selected combinations of the above technical features, but also encompasses other technical solutions formed by any combination of the above technical features or their equivalents without departing from the technical concept. For example, a technical solution may be formed by replacing the above features with the technical features with similar functions disclosed in the present disclosure (but not limited to).

What is claimed is:

1. A semiconductor device, comprising:
a base comprising a first surface defining at least one memory plane region; and
a stack structure disposed on the first surface and comprising a first portion located at an edge of the memory plane region and a second portion different from the first portion,
wherein
the first portion comprises first contact structures extending through the stack structure in a first direction and extending to the base;
the second portion comprises second contact structures extending through the stack structure in the first direction and extending to the base, and electrically connected with respective gate conductor layers in the stack structure; and a top surface of a first contact structure of the first contact structures away from the base is flush with a top surface of a second contact structure of the second contact structures away from the base.

2. The semiconductor device of claim 1, wherein the second portion comprises memory regions and staircase regions, the memory regions and the staircase regions being distributed in a second direction, wherein the memory regions comprise channel structures extending through the stack structure in the first direction, and the staircase regions comprise the second contact structures; and the first portion comprises first regions distributed in a third direction with the memory regions, wherein the first regions comprise the first contact structures, and the first direction, the second direction, and the third direction are perpendicular to one another.

3. The semiconductor device of claim 2, wherein each of the memory regions corresponds to at least one of the staircase regions, and the at least one of the staircase regions is located in a middle of a corresponding memory region to divide the corresponding memory region into at least two memory sub-regions.

4. The semiconductor device of claim 1, wherein the second portion further comprises a plurality of stepped staircases and a covering dielectric layer covering the plurality of stepped staircases; and the second contact structure comprises a first portion and a second portion, the first portion of the second contact structure extending through the covering dielectric layer in the first direction, extending to an upper surface of a corresponding gate conductor layer and electrically connected with the upper surface of the corresponding gate conductor layer, and the second portion of the second contact structure being connected with the first portion of the second contact structure and extending through the plurality of stepped staircases in the first direction into the base.

5. The semiconductor device of claim 4, wherein part of the first portion extending to the upper surface of the corresponding gate conductor layer extends in a plane perpendicular to the first direction, and is in contact with the upper surface of the corresponding gate conductor layer.

6. The semiconductor device of claim 4, wherein the first contact structure and the second contact structure have a same height in the first direction.

7. The semiconductor device of claim 4, wherein the second contact structure comprises a second conductive core layer, a second adhesive layer, and a second blocking layer sequentially from inside of the second contact structure to outside of the second contact structure; and the second blocking layer comprises a first sub-layer and a second sub-layer between which a spacing is arranged in the first direction.

8. The semiconductor device of claim 7, wherein the first contact structure comprises a first conductive core layer, a first adhesive layer, and a first blocking layer sequentially from inside of the first contact structure to outside of the first contact structure.

9. The semiconductor device of claim 8, wherein the first conductive core layer and the second conductive core layer are made of a same first material;

the first adhesive layer and the second adhesive layer are made of a same second material; and the first blocking layer and the second blocking layer are made of a same third material.

10. The semiconductor device of claim 4, wherein the semiconductor device further comprises a peripheral circuit; and the corresponding gate conductor layer is electrically connected with the peripheral circuit through the first portion of the second contact structure or the second portion of the second contact structure.

11. The semiconductor device of claim 10, wherein the peripheral circuit comprises a first peripheral circuit and a second peripheral circuit, the first peripheral circuit being disposed on a side of the stack structure away from the base, and the second peripheral circuit being disposed on a side of the base away from the stack structure; and the corresponding gate conductor layer is electrically connected with the first peripheral circuit through the first portion of the second contact structure or electrically connected with the second peripheral circuit through the second portion of the second contact structure.

12. A memory system, comprising:

a semiconductor device comprising:

a base comprising a first surface defining at least one memory plane region; and a stack structure disposed on the first surface and comprising a first portion located at an edge of the memory plane region and a second portion different from the first portion, wherein the first portion comprises first contact structures extending through the stack structure in a first direction and extending to the base;

the second portion comprises second contact structures extending through the stack structure in the first direction and extending to the base, and electrically connected with respective gate conductor layers in the stack structure; and a top surface of a first contact structure of the first contact structures away from the base is flush with a top surface of a second contact structure of the second contact structures away from the base; and a controller coupled to the semiconductor device and configured to control the semiconductor device to store data.

13. The semiconductor device of claim 1, wherein each of the first contact structures and each of the second contact structures have a same height in the first direction.

14. The semiconductor device of claim 1, wherein each of the second contact structures has a same height in the first direction.

15. The semiconductor device of claim 1, wherein a first portion of the second contact structure has a first radial dimension, and a second portion of the second contact structure, extending through the stack structure into the base, has a second radial dimension smaller than the first radial dimension.

16. The semiconductor device of claim 15, wherein the second contact structure is electrically connected with a corresponding gate conductor layer of the stack structure near a joint between the first portion of the second contact structure and the second portion of the second contact structure.

17. The semiconductor device of claim 1, wherein the second contact structure comprises a second conductive core layer, a second adhesive layer, and a second blocking layer sequentially from inside of the second contact structure to outside of the second contact structure, the second blocking layer comprising a first sub-layer and a second sub-layer spaced apart from the first sub-layer in the first direction.

18. The semiconductor device of claim 17, wherein the second contact structure is connected with a corresponding gate conductor layer of the stack structure through the second adhesive layer exposed at a position where the first sub-layer is spaced apart from the second sub-layer.

19. The semiconductor device of claim 1, wherein
the second contact structure comprises a first portion and a second portion connected to the first portion, the first and second portions of the second contact structure having different lateral dimensions in a direction perpendicular to the first direction; and
the first portion of the second contact structure extends in the first direction to be electrically connected with an upper surface of a corresponding gate conductor layer of the stack structure, and the second portion of the second contact structure extends in the first direction into the base.

20. The semiconductor device of claim 1, wherein
the second contact structure comprises a second conductive core layer, a second adhesive layer, and a second blocking layer sequentially from inside of the second contact structure to outside of the second contact structure; and
the second blocking layer is discontinuous in the first direction to form a spacing, and the second contact structure is electrically connected with a corresponding gate conductor layer through the second adhesive layer at the spacing.

* * * * *